US009455220B2

(12) United States Patent
Shroff et al.

(10) Patent No.: US 9,455,220 B2
(45) Date of Patent: Sep. 27, 2016

(54) APPARATUS AND METHOD FOR PLACING STRESSORS ON INTERCONNECTS WITHIN AN INTEGRATED CIRCUIT DEVICE TO MANAGE ELECTROMIGRATION FAILURES

(71) Applicants: Mehul D. Shroff, Austin, TX (US); Douglas M Reber, Austin, TX (US); Edward O. Travis, Austin, TX (US)

(72) Inventors: Mehul D. Shroff, Austin, TX (US); Douglas M Reber, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/292,886

(22) Filed: May 31, 2014

(65) Prior Publication Data

US 2015/0348898 A1   Dec. 3, 2015

(51) Int. Cl.
*H01L 21/4763* (2006.01)
*H01L 23/522* (2006.01)
*G06F 17/50* (2006.01)
*H01L 21/768* (2006.01)
*H01L 23/532* (2006.01)

(52) U.S. Cl.
CPC ....... *H01L 23/5226* (2013.01); *G06F 17/5077* (2013.01); *H01L 21/76877* (2013.01); *H01L 23/53238* (2013.01); *H01L 2924/0002* (2013.01)

(58) Field of Classification Search
CPC . H01L 23/528; H01L 21/768; H01L 23/522; G06F 17/50
USPC ............................ 438/637; 257/773; 716/130
See application file for complete search history.

(56) References Cited

U.S. PATENT DOCUMENTS

| 4,897,709 | A | 1/1990 | Yokoyama et al. |
| 5,712,510 | A | 1/1998 | Bui et al. |
| 6,197,613 | B1* | 3/2001 | Kung ................. H01L 23/3107 257/E21.508 |
| 6,488,823 | B1 | 12/2002 | Chiang et al. |
| 6,579,795 | B1 | 6/2003 | Hau-Riege |
| 6,725,433 | B1* | 4/2004 | Hau-Riege ......... G01R 31/2858 324/762.01 |
| 7,154,184 | B2 | 12/2006 | Asai et al. |
| 7,459,786 | B2 | 12/2008 | Shimazu et al. |
| 7,598,540 | B2* | 10/2009 | Doris .............. H01L 21/823807 257/200 |
| 7,964,502 | B2 | 6/2011 | Dao et al. |
| 8,178,950 | B2 | 5/2012 | Dao et al. |
| 8,188,574 | B2* | 5/2012 | Angyal ................. H01L 23/562 257/347 |
| 8,456,017 | B2 | 6/2013 | Dai et al. |
| 8,575,752 | B2 | 11/2013 | Herdt et al. |
| 8,598,714 | B2 | 12/2013 | Huisinga et al. |
| 2002/0070375 | A1 | 6/2002 | Chiang et al. |
| 2004/0251555 | A1 | 12/2004 | Asai et al. |
| 2006/0030143 | A1 | 2/2006 | Ivanov |

(Continued)

OTHER PUBLICATIONS

Christine S. Hau-Riege, The effect of interlevel dielectric on the critical tensile stress to void nucleation for the reliability of Cu interconnects, 2004, AIP Publishing, Journal of Applied Physics, vol. 96, Issue 10, 2004.*

(Continued)

*Primary Examiner* — Caleb Henry

(57) ABSTRACT

A method for selecting locations within an integrated circuit device for placing stressors to manage electromigration failures includes calculating an electric current for an interconnect within the integrated circuit device and determining an electromigration stress profile for the interconnect based on the electric current. The method further includes determining an area on the interconnect for placing a stressor to alter the electromigration stress profile for the interconnect.

9 Claims, 17 Drawing Sheets

(56) References Cited

U.S. PATENT DOCUMENTS

| | | | |
|---|---|---|---|
| 2006/0113672 A1* | 6/2006 | Wang | H01L 21/76801 257/760 |
| 2007/0145567 A1 | 6/2007 | Ning | |
| 2008/0272492 A1* | 11/2008 | Tsang | H01L 21/7682 257/758 |
| 2009/0032961 A1* | 2/2009 | Feustel | H01L 21/76805 257/773 |
| 2009/0115072 A1 | 5/2009 | Rhyner et al. | |
| 2009/0243109 A1* | 10/2009 | Nopper | H01L 21/76814 257/758 |
| 2010/0072588 A1 | 3/2010 | Yang | |
| 2010/0230824 A1* | 9/2010 | Lee | H01L 23/528 257/774 |
| 2011/0101531 A1 | 5/2011 | Neuilly et al. | |
| 2011/0204517 A1 | 8/2011 | Gu et al. | |
| 2012/0153480 A1* | 6/2012 | Pfuetzner | H01L 21/76814 257/751 |
| 2013/0161824 A1 | 6/2013 | Choi et al. | |
| 2013/0221494 A1 | 8/2013 | Ramachandran et al. | |
| 2013/0249011 A1 | 9/2013 | Choi et al. | |
| 2013/0320562 A1 | 12/2013 | Miyajima | |
| 2014/0103533 A1* | 4/2014 | Bedell | H01L 21/76898 257/773 |
| 2014/0117558 A1* | 5/2014 | Boyanov | H01L 21/76883 257/774 |
| 2014/0264922 A1* | 9/2014 | Chen | H01L 23/5226 257/774 |
| 2014/0353841 A1 | 12/2014 | Reber et al. | |
| 2015/0040092 A1* | 2/2015 | Reber | G06F 17/5072 716/119 |
| 2015/0145120 A1 | 5/2015 | Lee | |
| 2015/0194429 A1* | 7/2015 | Moroz | H01L 21/823821 257/369 |
| 2015/0228555 A1 | 8/2015 | Rabie et al. | |
| 2015/0249048 A1* | 9/2015 | Shroff | H01L 23/528 257/773 |

OTHER PUBLICATIONS

Mohit Pathak, Electromigration Modeling and Full-chip Reliability Analysis for BEOL Interconnect in TSV-based 3D ICs, Department of ECE, Georgia Institute of Technology, IEEE, 2011.*

Unpublished U.S. Appl. No. 14/193,866, filed Feb. 28, 2014. Title: "Stress Migration Mitigation Utilizing Induced Stress Effects in Metal Trace of Integrated Circuit Device." Inventors: Mehul D. Shroff, Douglas M. Reber, and Edward O. Travis.

U.S. Appl. No. 14/539,421, Shroff, M. et al., "Through-Substrate Vias (TSVs) and Method Therefor", Office Action—Restriction, mailed Dec. 9, 2015.

Huang et al, "Numerical Modeling and Characterization of the Stress Migration Behavior Upon Various 90 nanometer Cu/Low k Interconnects", Proceedings of the IEEE International Interconnect Technology Conference, Jun. 2-4, 2003, pp. 207-209.

Ogawa et al, "Stress-Induced Voiding Under Vias Connected To Wide Cu Metal Leads", 40th Annual Reliability Physics Symposium Proceedings, 2002, pp. 312-321.

Wang et al, "Interfacial Stress Characterization for Stress-induced Voiding in Cu/Low-k Interconnects", Proceedings of the 12th International Symposium on the Physical and Faillure analysis of Integrated Circuits, Jun. 27-Jul. 1, 2005, pp. 96-99.

"Ion Beam Deposition", <http://en.wikipedia.org/w/index.php?title=ion_beam_deposition&printable=yes>, Accessed May 28, 2014, 1 pages.

"Electron Beam-Induced Deposition", <http://en.wikipedia.org/w/index.php?title=electron_beam-induced_deposition&printable=yes>, Accessed May 28, 2014, 4 pages.

Chidambaram et al, "TSV Stress Testing and Modeling for 3D IC Applications", 16th IEEE International Symposium on the Physical and Failure Analysis of Integrated Circuits, Jul. 1-10, 2009, pp. 727-730, Suzhou, Jiangsu.

Oates et al, "Electromigration Failure Distributions of Cu/Low-k Dual-Damascene Vias: Impact of the Critical Current Density and a New Reliability Extrapolation Methodology", IEEE Transactions on Device and Materials Reliability, Jun. 2009, pp. 244-254, vol. 9, No. 2.

Ogawa et al, "Statistics of Electromigration Early Failures in Cu/Oxide Dual-Damascene Interconnects", IEEE 39th Annual International Reliability Physics Symposium, 2001, pp. 341-349, Orlando, Florida.

Heryanto et al, "Study of Stress Migration and Electromigration Interaction in Copper/Low-K Interconnects", 2010, pp. 586-590.

Hall et al, "Impact of Via Interactions and Metal Slotting on Stress Induced Voiding", 46th Annual International Reliability Physics Symposium, 2008, pp. 392-398, Phoenix.

Matsuyama et al, "Stress Migration Phenomena in Narrow Copper Lines", 2006, pp. 28-30, IIRW Final Report.

Kouno et al, "Stress-Induced Voidino Under Vias Connected to "Narrow" Copper Lines", Electron Devices Meeting, 2005, 187-190.

U.S. Appl. No. 14/539,421, Shroff, M. et al., "Through-Substrate Vias (TSVs) and Method Therefor", Office Action—Non-Final Rejection mailed Mar. 10, 2016.

U.S. Appl. No. 14/193,866, Shroff, M. et al., "Stress Migration Mitigation Utilizing Induced Stress Effects in Metal Trace of Integrated Circuit Device", Office Action—Restriction mailed Mar. 26, 2015.

U.S. Appl. No. 14/193,866, Shroff, M. et al., "Stress Migration Mitigation Utilizing Induced Stress Effects in Metal Trace of Integrated Circuit Device", Office Action—Non-Final Rejection mailed Jun. 1, 2015.

U.S. Appl. No. 14/193,866, Shroff, M. et al., "Stress Migration Mitigation Utilizing Induced Stress Effects in Metal Trace of Integrated Circuit Device", Notice of Allowance mailed Jul. 10, 2015.

* cited by examiner

APPARATUS AND METHOD FOR PLACING STRESSORS ON INTERCONNECTS WITHIN AN INTEGRATED CIRCUIT DEVICE TO MANAGE ELECTROMIGRATION FAILURES

FIELD

The present disclosure relates generally to managing electromigration failures in integrated circuit devices and more particularly to placing stressors within integrated circuit devices to manage electromigration failures within the devices.

BACKGROUND

Advances in fabrication techniques for integrated circuits and consumer demand for more powerful and feature-rich electronic devices have driven the evolution of integrated circuits over the past several decades. An observation that the number of transistors in integrated circuits doubles approximately every two years is known as Moore's law. As the number of transistors within an integrated circuit increases, so must the number of conductive pathways that interconnect them and link them with other elements in the integrated circuit. Traditionally, interconnects within integrated circuits were formed by the subtractive etching of aluminum patterned by a photoresist process. With the decreasing size and increasing performance of integrated circuits, a transition from aluminum to copper was made in the early 1990s for the metal used to form interconnects. Copper is a better conductor than aluminum, allowing for thinner interconnects that are less prone to Joule heating. Copper also has a greater thermal conductivity than aluminum, providing more efficient heat conduction paths.

A lack of volatile compounds for copper does not allow it to be patterned by the subtractive techniques used for aluminum. Instead, copper interconnects within integrated circuits are patterned in an additive way using a dual-damascene process that involves etching a dielectric material, such as silicon dioxide, and filling the resulting patterned trenches and holes with copper. A barrier layer is used to surround the copper interconnects to prevent metal from diffusing into the surrounding dielectric and degrading the performance of the semiconductor. Silicon, for example, forms deep-level traps when doped with copper, and copper migrates easily in silicon dioxide.

Currently, interconnects have shrunk to the point where, despite the use of copper, difficulties are presenting themselves. One such difficulty is electromigration, an undesired process by which metal atoms within an interconnect are dislodged and displaced by an electric current. Particularly at the barrier layers, displaced copper atoms create regions of tensile and compressive stress that depend on current levels and directions. Tensile stress causes voiding, which eventually breaks the conduction pathway of an interconnect, and compressive stress causes hillocking, which eventually causes the interconnect to short circuit. With higher current densities that result from making interconnects with smaller cross-sectional areas, the effects of electromigration increase.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
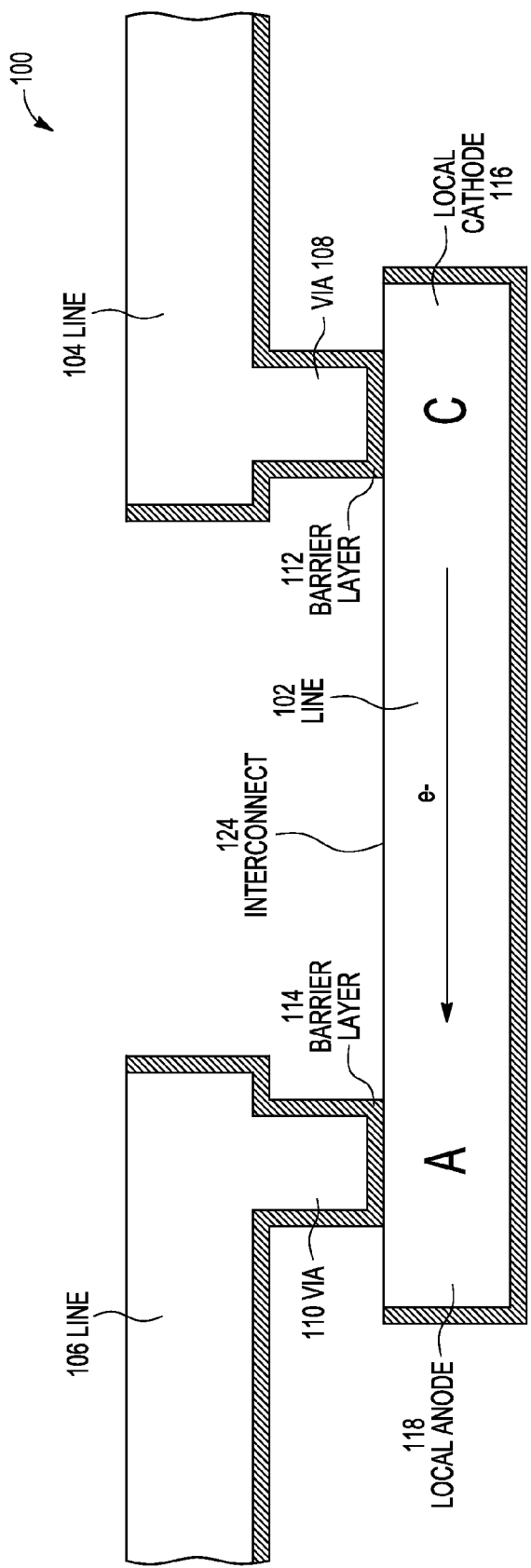
FIG. 1 illustrates a cross-sectional view of a partial interconnect structure without stressors that is prone to electromigration failure.

The present disclosure is illustrated by way of example, as reflected in one or more disclosed embodiments, and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to the dimensions of other elements to help to improve understanding of embodiments, disclosed or otherwise, of the present disclosure.

The apparatus and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Also, the functions included in the flow diagrams do not imply a required order of performing the functionality contained therein.

DETAILED DESCRIPTION

Discussed embodiments increase the mean lifetime of integrated circuit devices or allow them to be made smaller by reducing the occurrence of electromigration failures in select areas of such devices, such as at via locations. More particularly, by placing stressors to selectively stress interconnects within integrated circuit devices at or near vias, electromigration stress profiles for the interconnects can be altered to displace hillocking and void formation away from the vias.

In accordance with an embodiment is a method, which can be performed by a circuit simulation system, for selecting locations within an integrated circuit device for placing stressors to manage electromigration failures. The method includes calculating an electric current for an interconnect within the integrated circuit device and determining an electromigration stress profile for the interconnect based on the electric current calculated. The method further includes determining an area on the interconnect for placing a stressor to alter the electromigration stress profile for the interconnect. For a particular embodiment, the area is within a threshold distance of a via that is in electrical contact with the interconnect.

In accordance with another embodiment is a method for manufacturing an integrated circuit device that includes stressors to manage electromigration failures. The method includes forming a first line in a first metal layer of the integrated circuit device, wherein the first line forms at least a portion of an interconnect. The method also includes forming a second line in a second metal layer of the integrated circuit device and forming a via coupling the first line to the second line. The method further includes forming a stressor at an area of the interconnect, wherein the area at least partially overlaps the via, wherein the stressor alters an electromigration stress profile for the interconnect by altering a stress at the area to be less tensile.

In accordance with a further embodiment is an integrated circuit device that includes stressors to manage electromigration failures. The integrated circuit device includes a first line in a first metal layer of the integrated circuit device, wherein the first line forms at least a portion of an interconnect. The integrated circuit device also includes a second line in a second metal layer of the integrated circuit device and a via that couples the first line to the second line. The integrated circuit device further includes a stressor disposed at an area of the interconnect within a threshold distance of the via, wherein the stressor alters an electromigration stress profile for the interconnect by altering a stress at the area to be less tensile.

An integrated circuit (IC) device, such as an IC or an IC package, as used herein, is any device made from a semiconductor that includes electronic components and/or circuits and at least one interconnect. An interconnect, as used herein, is a metal pathway, which includes at least a line and may also include one or more vias, and which is configured to conduct an electric current. The electric current can be generated or passed, for instance, by one or more electronic components and/or devices within the IC device, such as capacitors and transistors. In at least one embodiment, two or more interconnects are separated by a barrier layer that prevents the diffusion of metal atoms between the interconnects, which can impact the selection of the locations to place one or more stressors. The metal used to form interconnects can include copper, aluminum, or any other metal in which electromigration can occur.

The following description refers to lines, vias, interconnects, or other features being "coupled" or "connected" together. As used herein, unless expressly stated otherwise, "coupled" means that one feature is indirectly joined to another feature through an intermediary feature. For example, a first line is coupled to a second when the lines are not in direct contact with each other but when a via placed between the lines is connected to each line. The first line and the second line are electrically coupled to each other if the via placed between the lines supports an electric current that flows from one line to the other line. As used herein, unless expressly stated otherwise, "connected" means that one feature is directly joined to or is in direct contact with another feature without an intermediary feature existing between them. Intermediary features are not inclusive of thin films, such as barrier or seed layers. For example, a line is connected to a via if no other feature, with the exception of one or more thin films, separates the line from the via. The line and the via are electrically connected or in electrical contact with each other if the connection supports a current that flows between them.

Referring now to the drawings, and in particular FIG. 1, a cross-sectional view 100 of a portion of an interconnect structure that includes an interconnect that is prone to electromigration failure is illustrated. Specifically, FIG. 1 shows a line 102 that is electrically coupled to a line 104 through a via 108 and that is also electrically coupled to a line 106 through a via 110. Although not shown in any of the drawings herein that illustrate interconnects, such as FIG. 1, the lines and vias are surrounded by a dielectric material, or dielectric for short, which serves as an electrical insulator.

For a particular embodiment, the partial interconnect structure 100 is formed using a dual-damascene process. The dual-damascene process is a process by which interconnects are formed in a dielectric of an IC device by etching holes and trenches in the dielectric and then depositing a metal conductor, such as copper, in both features to form a metal layer of vias and lines, respectively, within the IC device. In etching the dielectric, either the holes or the trenches can be etched first. A barrier layer is then deposited, for example, by physical vapor deposition (PVD), in the holes and trenches which will stop the diffusion of metal into the semiconductor. Barrier layers can include, but are not limited to, tantalum, tantalum nitride, or titanium nitride. Copper is then deposited, for example, by electroplating, after which the surface of the metal is planarized by a process such as chemical mechanical polishing. As used herein, vias and lines are both electrical conductors, a via being a metal-filled hole, and a line being a metal-filled trench.

Within the partial interconnect structure 100, the line 102 forms an interconnect 124. The interconnect 124 conducts an electric current between the via 108 and the via 110 but does not include the via 108 or the via 110. This is because the via 108 is separated from the interconnect 124 by a barrier layer 112, and the via 110 is separated from the interconnect 124 by a barrier layer 114. The terms "electric current" and "current" are used interchangeably herein and are defined to be the movement or flow of negative charge carriers, namely electrons, within a conductor. A local cathode 116 and a local anode 118 for the interconnect 124 are determined based on a direction of the current in the interconnect 124. A local cathode for an interconnect is defined as a current source for the interconnect, and a local anode for the interconnect is defined as a current sink for the interconnect. A local cathode includes a volume of metal within an interconnect that is near or close to, in comparison to a length of the interconnect, an area on the interconnect where an electric current enters the interconnect. Similarly, a local anode includes a volume of metal within an interconnect that is near or close to, in comparison to a length of the interconnect, an area on the interconnect where an electric current leaves the interconnect.

Figure 2:
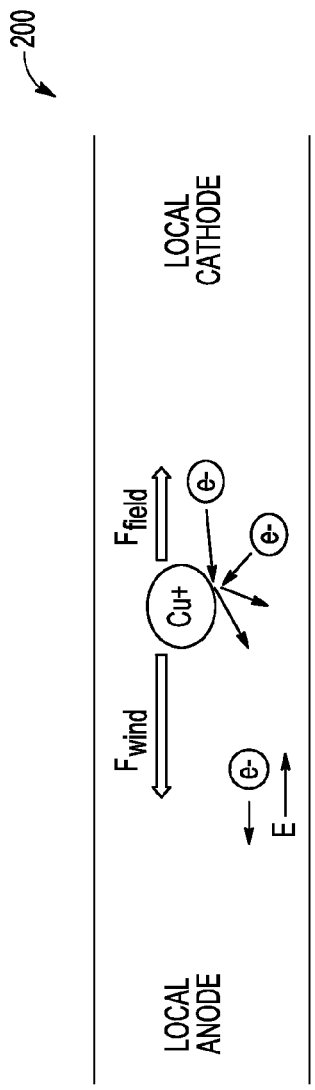
FIG. 2 illustrates electromigration within an interconnect.

The movement of electrons from the local cathode 116 to the local anode 118 within the metal of the interconnect 124 creates an "electron wind" that pushes ionized metal atoms dislodged from a lattice within the interconnect 124 toward the local anode 118. A diagram 200 of FIG. 2 illustrates the electron wind in the interconnect 124. Electrons collide with metal atoms in the interconnect 124 and impart a momentum to the metal atoms that can move the atoms in a direction of the electric current. This movement of the metal atoms is a known phenomenon and is referred to as electromigration. On average, if the electric current caused by an electric field within the interconnect 124 is great enough, a force of the electron wind $F_{wind}$ pushing positively charged metal atoms toward the local anode 118 is greater than a force of the electric field $F_{field}$ pulling the metal ions toward the local cathode 116.

Figure 3:
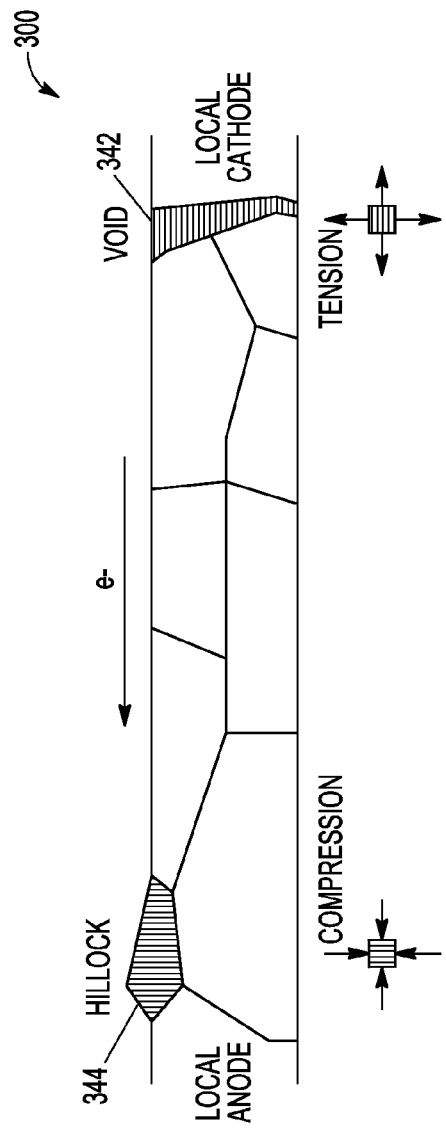
FIG. 3 illustrates void and hillock formation within an interconnect.

FIG. 3 shows a diagram 300 illustrating that the electromigration of metal atoms within the interconnect 124 creates voiding at the local cathode 116 for the interconnect 124, as indicated at 342, and creates hillocking at the local anode 118 for the interconnect 124, as indicated at 344. Voiding occurs because the barrier layer 112 does not allow metal atoms to move from the via 108 into the interconnect 124 to replace those metal atoms that were dislodged and moved from below the barrier layer 112 toward the local anode 118. The metal within the interconnect 124 at the local cathode 116 is left in tension. As metal is removed from below the barrier layer 112, the current density in the remaining metal increases, which, in turn, accelerates the erosion of the remaining metal and causes the void to grow. When enough metal is removed, an electromigration failure results as the void breaks the conductive pathway.

Hillocking is caused by the accumulation of metal atoms at the local anode 118. As metal atoms migrate into the local-anode region of the interconnect 124, the atoms are unable to pass through the barrier layer 114 into the via 110. As a result, the metal atoms "pile up" at the local anode 118 and increase the compressive stress there. With enough compressive stress, the metal atoms begin to extrude from the interconnect 124 and can cause an electromigration failure by shorting to vias and lines not meant to be in electrical contact with the interconnect 124.

Figure 4:
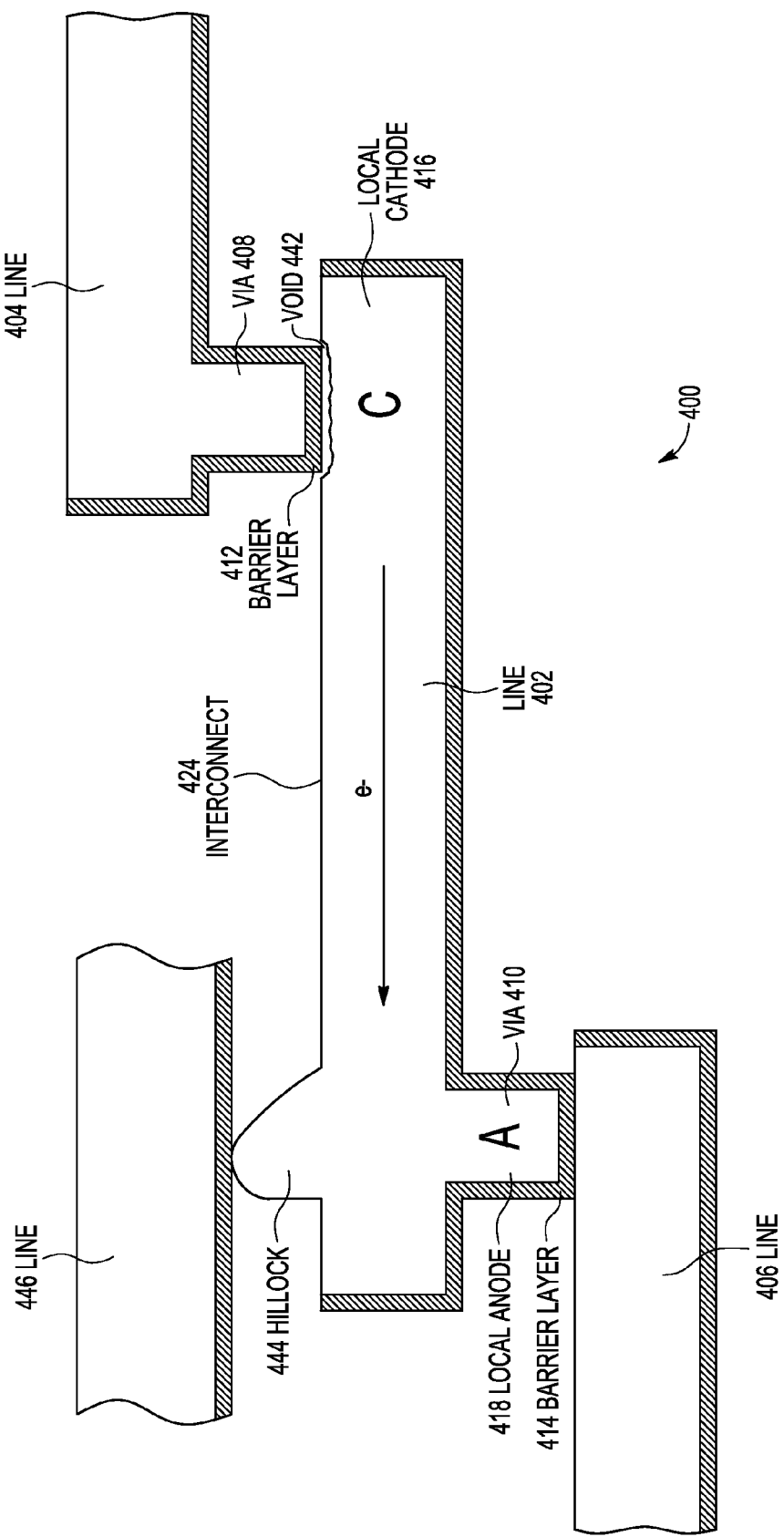
FIG. 4 illustrates electromigration failures within an interconnect.

FIG. 4 shows electromigration failures within a partial interconnect structure 400. The partial interconnect structure 400 includes an interconnect 424 formed by a line 402, which is electrically connected to a via 408 and a line 404 across a barrier layer 412. The partial interconnect structure 400 also includes a via 410, which is electrically connected to a line 406 across a barrier layer 414. A void 442 is formed below the barrier layer 412 at a local cathode 416 for the interconnect 424. Voids continue to grow in size as an electric current continues to remove metal atoms. The void 442 represents an electromigration failure where the line 402 is no longer in electrical contact with the via 408. At a local anode 418 of the interconnect 424, metal extrudes from the line 402 to the point of forming a hillock 444. The hillock 444 creates an electromigration failure by short circuiting the line 402 to a line 446.

Embodiments include a method for managing electromigration failures in interconnects through the placement of stressors on or within the interconnects. A stressor, as used herein, is an element that alters a stress state of a metal within an interconnect in the vicinity of where the stressor is placed. Two types of stressors are defined, a compressive stressor, which imparts a tensile stress on the metal to which it is applied, and a tensile stressor, which imparts a compressive stress on the metal to which it is applied. A stress within a metal of an interconnect can be quantified by a unit of pressure, such as a Pascal, for example.

Applying a tensile stress to a metal in a relaxed or stress-free state puts the metal in a state of tension, and applying a compressive stress to a metal in a relaxed state puts the metal in a state of compression. Applying a tensile stress, however, to a metal that is in a state of compression may be insufficient to put the metal in a tensile state. The metal might simply be left in a less-compressive state. Likewise, applying a compressive stress to a metal that is in a state of tension may be insufficient to put the metal in a compressive state. The metal might simply be left in a less-tensile state.

In some embodiments, a stressor is formed as a stress-inducing dielectric material or a stress-inducing conductive material overlying an area of an interconnect. For example, stressors can be formed from silicon nitride, silicon-rich nitride, or silicon oxynitride. Additionally, when deposited under certain conditions, tantalum nitride or titanium nitride can act as a stressor. A stress-inducing dielectric material or a stress-inducing conductive material may be formed through a selective deposition process or a layer patterning process. In some embodiments, the resulting stressors have a thickness of approximately a few hundred angstroms, but for other embodiments, stressors may be thicker or thinner than this. Stressors are formed under different conditions to create different stress profiles and impart a physical or mechanical force to the interconnects to which they are applied. In other embodiments, a stressor may be formed as a part of the interconnect itself, whereby a stress memorization technique (SMT) is used to induce a stress memory effect in a region of the interconnect itself, such that the stress effect is essentially "memorized" or retained in the region of the interconnect. In such instances, reference to a "stressor" refers to that region of the metal within the interconnect that exhibits the induced stress memory effect. Thus, as used herein, the term "stressor" refers to either a region of an interconnect having an induced stress memorization effect or to material overlying an interconnect.

Figure 5:
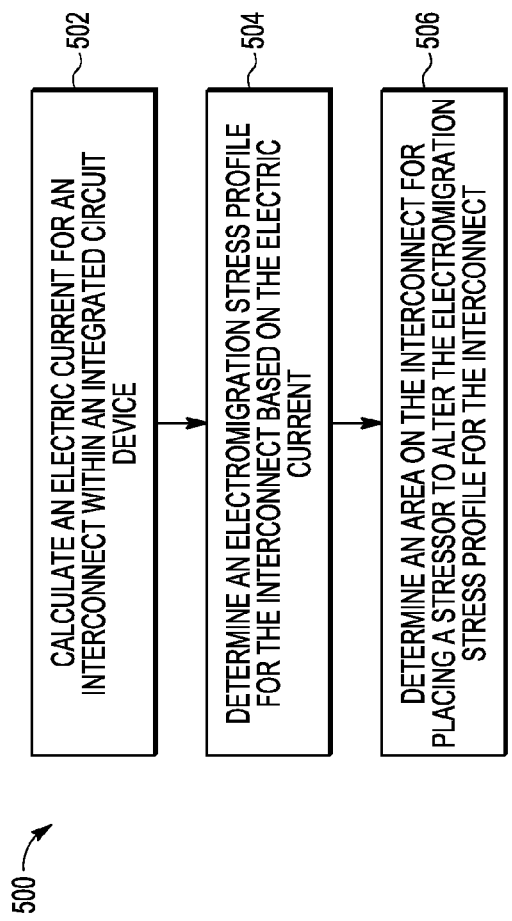
FIG. 5 is a flow diagram illustrating a method for determining the placement of a stressor on an interconnect, in accordance with an embodiment.

FIG. 5 is a logical flow diagram of a method 500 for determining the placement of a stressor on an interconnect. The method 500 includes calculating 502 an electric current for an interconnect within an integrated circuit device. It is a direct current or an effective net direct current flowing within an interconnect which causes cumulative effects of stress migration. A direct current is a unidirectional flow of electric charge, and an effective net direct current is an average current flowing in a particular direction.

Figure 6:
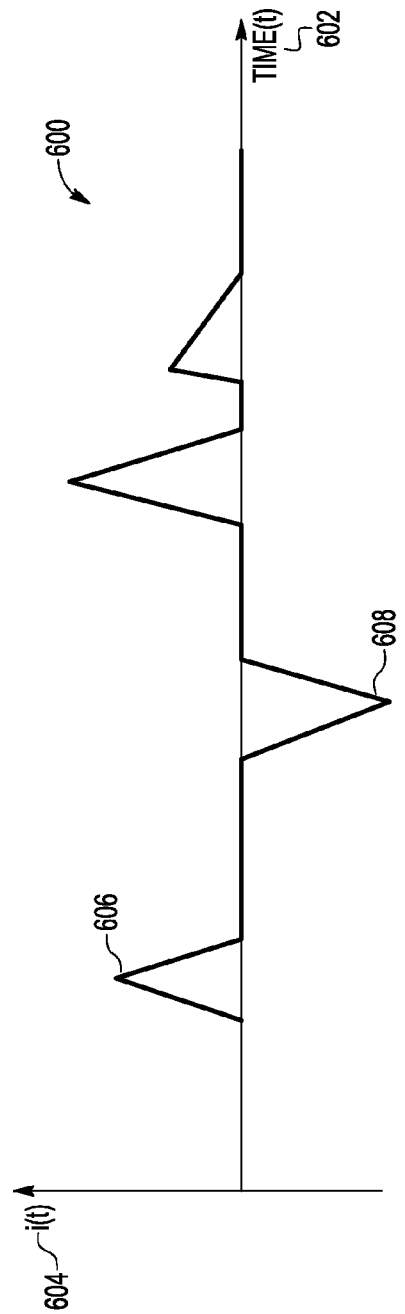
FIG. 6 illustrates a plot of current within an interconnect as a function of time to determine placement of a stressor, in accordance with an embodiment.

Not all interconnects within an IC device carry a direct current. While some interconnects supply a steady voltage to different locations within the IC device, for example, other interconnects carry signals in the form of time-dependent currents that can reverse direction. Turning momentarily to FIG. 6, a plot 600 of a time-dependent current that reverses direction is shown. An abscissa axis 602 specifies time and an ordinate axis 604 specifies an instantaneous current, which for the plot 600 is sometimes in a positive direction (above the abscissa axis 602), as indicated at 606, and sometimes in a negative direction (below the abscissa axis 602), as indicated at 608.

To determine an effective net direct current that drives electromigration within an interconnect from a varying current waveform, a circuit simulation system can perform a time average of the instantaneous current within the interconnect over a period of the waveform if the waveform is periodic. In the absence of periodicity, the circuit simulation system can perform an average of the instantaneous current over a selected or designated time interval to determine an effective net direct current that drives electromigration. For currents that reverse direction, it is the effective net direct current within an interconnect that defines a local cathode and a local anode for the interconnect in terms of a source and a sink, respectively, for the effective net direct current.

For an embodiment, the effective net direct current for an interconnect is calculated as a time-averaged current over a time interval T using the expression:

$$\frac{1}{T}\int_0^T i(t)dt. \quad (1)$$

If the effective net direct current is less than a threshold current value, then a risk of electromigration failure for the interconnect is considered acceptable and a stressor is not applied to the interconnect. If, however, the effective net direct current is greater than the threshold current, then a stressor might be applied to the interconnect to mitigate the probability or delay the onset of an electromigration failure for the interconnect. In different embodiments, the threshold current value is determined empirically, by analyzing test data, or theoretically, by applying physical principles.

Returning to FIG. 5, the method 500 additionally includes determining 504 an electromigration stress profile for the interconnect based on the direct or the effective net direct current calculated for the interconnect. As used herein, an electromigration stress profile, or stress profile for short, for an interconnect refers to a spatial distribution for the stress state of the metal within the interconnect, where electric current flowing through the interconnect affects the stress state. A stress gradient, as used herein, refers to how the stress state changes with distance. A stress gradient for an interconnect caused by electromigration increases with an increase in a direct or an effective net direct current for the interconnect. It is a net current that flows in a direction which causes stress in a metal of an interconnect to become more compressive or less tensile in that direction.

For a particular embodiment, determining an electromigration stress profile based on an electric current calculated for an interconnect includes determining the electromigration stress profile based on an electric current density calculated for the interconnect. As defined herein, an "electric current density," or simply a "current density," is an amount of current passing through a unit area of an interconnect. For example, a circuit simulation system might determine electromigration stress profiles for interconnects within an IC device having different cross-sectional areas. An interconnect that carries only half the current of another interconnect may have twice the current density of the other interconnect if its cross-sectional area is a quarter of that of the other interconnect.

A higher current density causes a greater rate of localized voiding per unit volume at a local cathode of an interconnect. If an interconnect has a small cross-sectional area with less material to void, then a lower mean lifetime before failure results. Taking current density into account when determining where to apply stressors allows the mean lifetime of those IC devices that include interconnects of different cross-sectional areas to be extended. In the alternative, higher current limits can be set with the use of stressors, allowing for the use of thinner interconnects, which reduces the form factor for IC devices.

After determining that a stressor will be used for an interconnect, the method 200 further includes determining 506 an area on the interconnect for placing the stressor to alter the electromigration stress profile for the interconnect. For some embodiments, the area is determined for placing the stressor to oppose a stress gradient identified by the electromigration stress profile for the interconnect.

Figure 7:
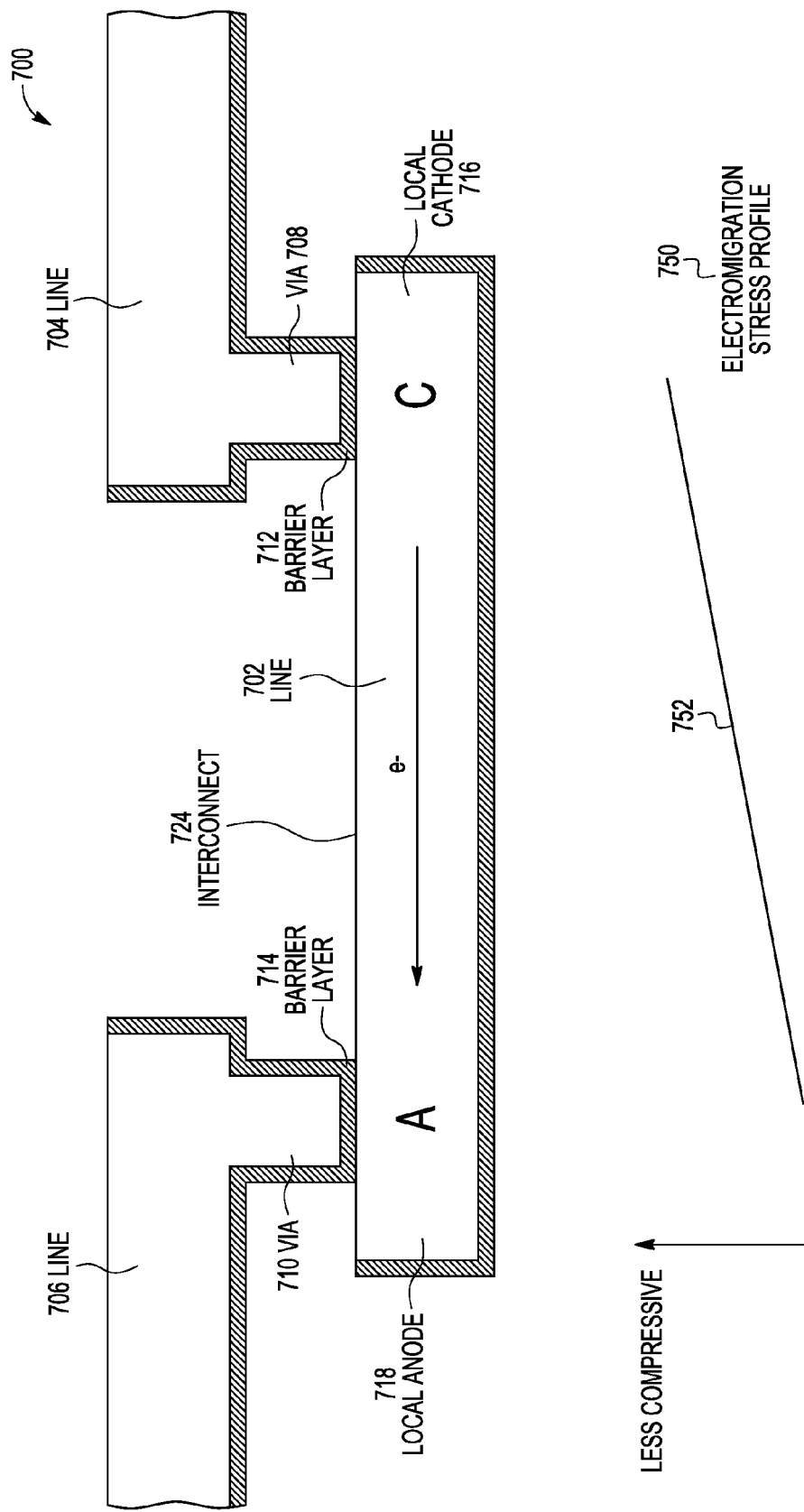
FIG. 7 illustrates a plot of an electromigration stress profile for an interconnect without stressors.

FIG. 7 shows a partial interconnect structure 700 and an electromigration stress profile 750 for an interconnect 724. The interconnect 724, which is formed by a line 702, is separated from a via 708 and a line 704, which are both part of another interconnect, by a barrier layer 712. The interconnect 724 is additionally separated from a via 710 and a line 706, which are also both part of another interconnect, by a barrier layer 714. Within the interconnect 724, an electric current, whether it be a direct current or an effective net direct current, flows from a local cathode 716 to a local anode 718. This electric current results in the electromigration stress profile shown at 750. For one embodiment, determining the electromigration stress profile 750 based on the electric current calculated for the interconnect 724 includes determining the electromigration stress profile 750 based on a time-averaged electric current for the interconnect 724. As indicated by the feature 752, the electromigration stress profile 750 transitions from being more tensile or less compressive at the local cathode 716 of the interconnect 724 to being more compressive or less tensile at the local anode 718 of the interconnect 724.

Embodiments include altering an electromigration stress profile of an interconnect to mitigate or reduce electromigration failures in the interconnect by determining a local anode or a local cathode for the interconnect for placement of a stressor based on an electric current calculated for the interconnect. One embodiment includes determining an area on the interconnect at the local anode for placing a stressor to alter the electromigration stress profile for the interconnect by altering a stress in the first interconnect at the area to be less compressive.

Figure 8:
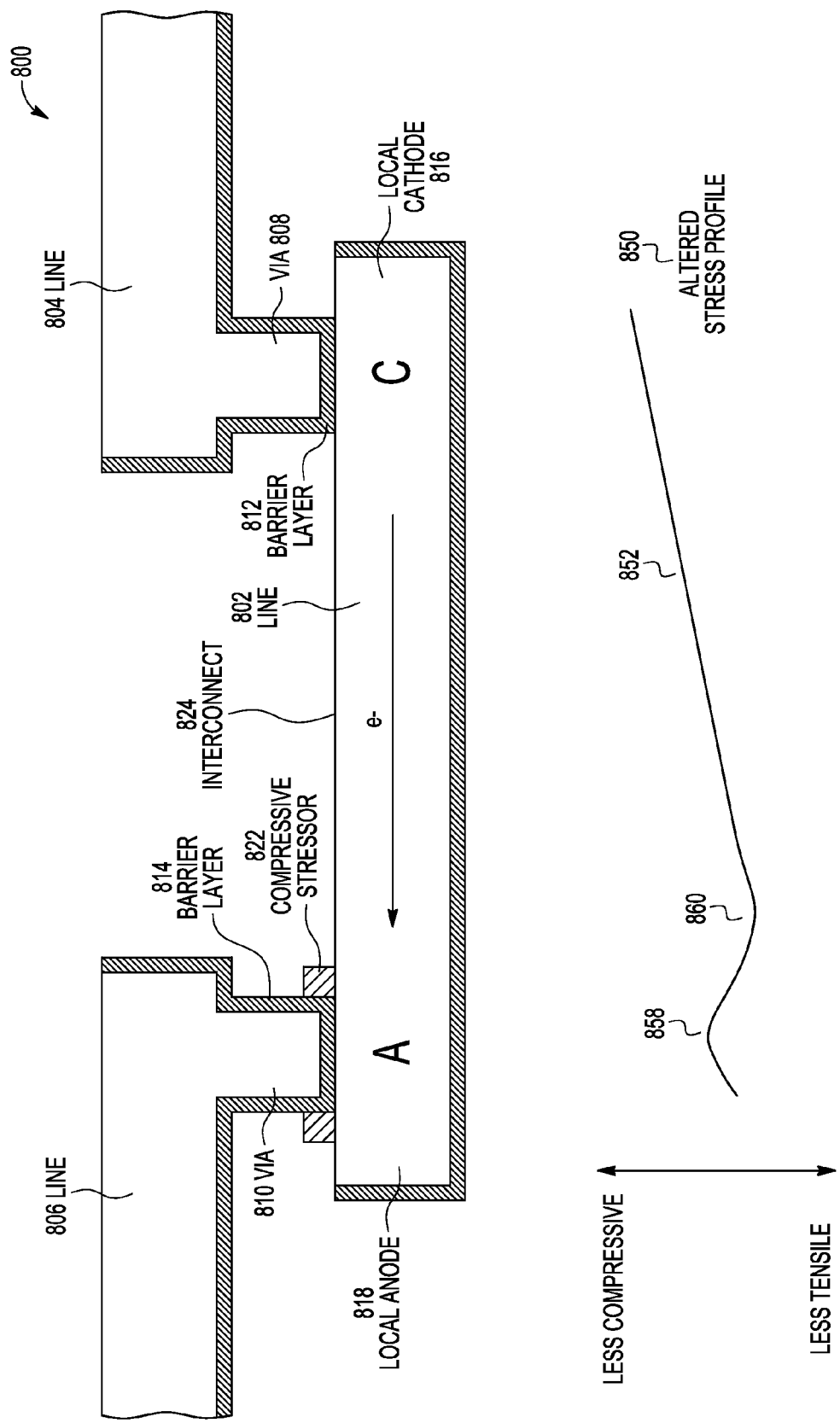
FIG. 8 illustrates a plot of an altered stress profile for an interconnect with a compressive stressor, in accordance with an embodiment.

FIG. 8 shows an embodiment of a partial interconnect structure 800 for which a compressive stressor 822 is placed on an interconnect 824, formed by the line 802, at a local anode 818 for the interconnect 824. The stressor 822 is placed based on a determined electric current in the interconnect 824, which defines a local cathode 816 and the local anode 818 for the interconnect 824. Electrons flow into the interconnect 824 from a line 804 and a via 808 through a barrier layer 812, and the electrons flow out of the interconnect 824 to a via 810 and a line 806 through a barrier layer 814.

By placing compressive stressor 822 on the interconnect 824 at the local anode 818, an electromigration stress profile 850 for the interconnect 824 is altered as compared to the electromigration stress profile 750 for the interconnect 724. As indicated at 858, the compressive stressor 822 causes stress in the metal at the local anode 818 to become less compressive than it would be in the absence of the stressor 822. This reduces the occurrence of hillocking at the local anode 818.

The effect the stressor 822 has is local to the region of the local anode 818, where the stressor 822 is placed. A local minimum 860 results in the altered stress profile 850 as shown where the feature 858 and a feature 852 meet. If a hillock were to form, it would be statistically more likely to form in a region of the interconnect 824 corresponding to this local minimum 860, where the compressive stress is highest, and less likely to form in a region of the interconnect 824 under the compressive stressor 822. Thus, placing the compressive stressor 822 has the effect of displacing hillocking when the current is sufficiently high to cause hillocking. Compressive stressors can be placed on the anode side of interconnects in regions where hillocking could compromise the interconnects, for example, in regions where the interconnects are in proximity to elements within an IC device with which the interconnects could short circuit.

In one embodiment, the stressor 822 is placed on the interconnect 824 at an area within a threshold distance of the via 810. For example, the stressor 822 can be placed or centered within a lateral or vertical threshold distance of the via 810 of up to five times a lateral or vertical dimension, respectively, of the via 810. For a particular embodiment, the stressor 822 is void of material within its interior, for example, at its center, to allow the via 810 to pass through the stressor 822 and make electrical contact with the interconnect 824. In other embodiments, a stressor is placed on an interconnect above a location of a via, wherein the via does not pass through the stressor. Such an embodiment is illustrated by FIG. 9, wherein a stressor is located within a vertical distance of a via included within an interconnect that is approximately the thickness of the interconnect when the stressor is formed above the via on an opposite side of the interconnect to a via.

Figure 9:
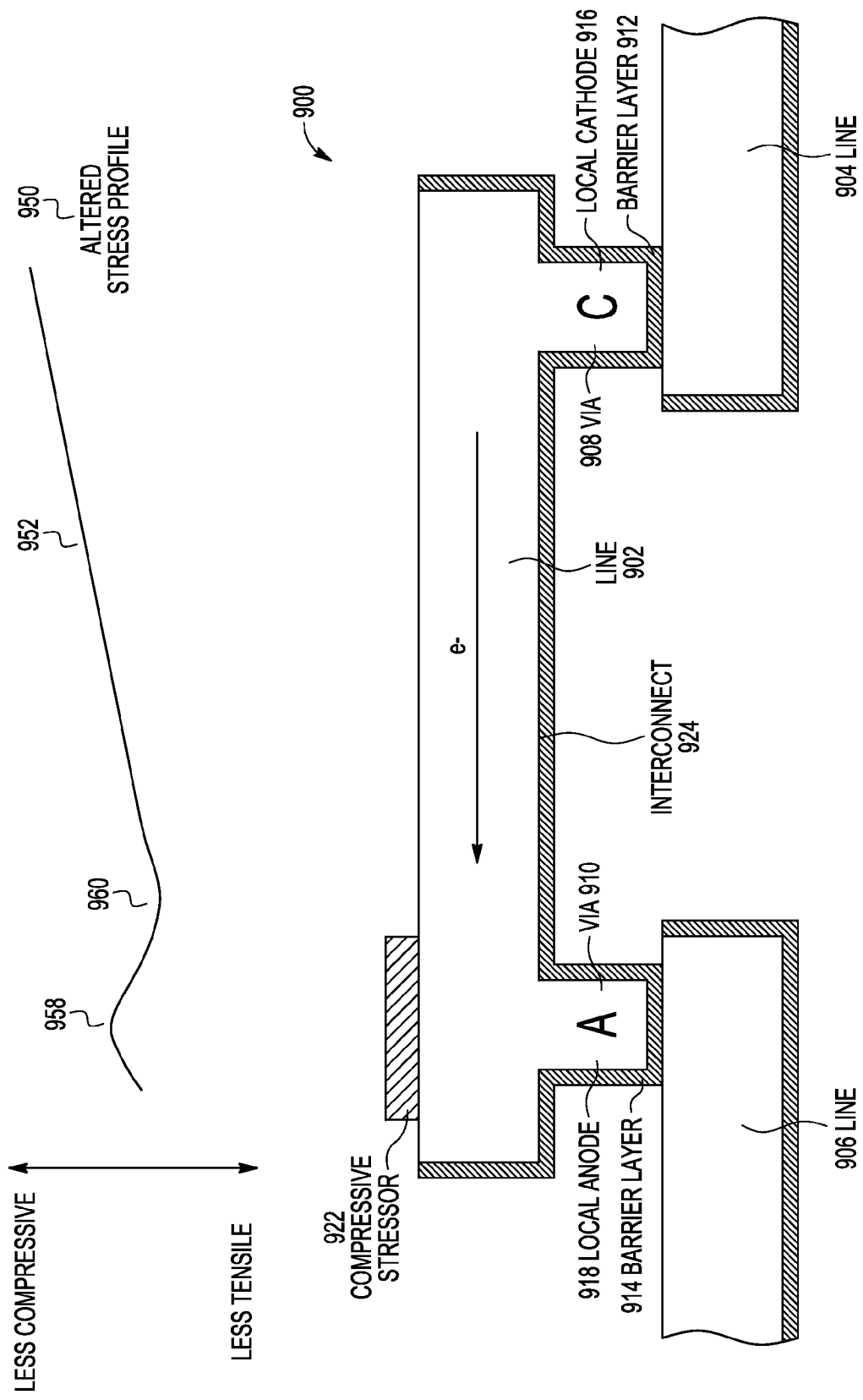
FIG. 9 illustrates a plot of an altered stress profile for an interconnect with a compressive stressor, in accordance with an embodiment.

FIG. 9 shows a partial interconnect structure 900 with an interconnect 924 that includes vias 908 and 910 in addition to a line 902. For example, the vias 908 and 910 are formed together with the line 902 in a single metal deposition step of a dual-damascene process. This results in a barrier layer 912 between the interconnect 924 and a line 904, at the lower-end of the via 908, and a barrier layer 914 between the interconnect 924 and a line 906, at the lower-end of the via 910. While labeled differently herein, the barrier layers 912 and 914 are formed together as parts of a same barrier layer deposited for the dual-damascene process. An electric current within the interconnect 924 defines a local cathode 916 for the interconnect 924, which coincides with the location of the via 908, and a local anode 918 for the interconnect 924, which coincides with the location of the via 910.

A compressive stressor 922 is placed on the interconnect 924 at the via 910. In this case, instead of being placed adjacent to the via 910, as a consequence of the dual-damascene process, the stressor 922 is placed adjacent to the line 902 in an area directly above the via 910. Accordingly, because the via 910 is positioned below the line 902, the compressive stressor 922 does not include an opening that would otherwise be needed to accommodate the via 910. An altered stress profile 950 for the interconnect 924 resulting from the compressive stressor 922 includes the features 952, 958, and 960, and appears much the same as the altered stress profile 850 for the interconnect 824. Away from the stressor 922, the stress profile becomes more compressive the direction of the local anode 918 as indicated by the feature 952. This trend continues until a local minimum is reached, indicated as the feature 960, beyond the physical extent of the stressor 922. Underneath the stressor 922, the altered stress profile 950 becomes less compressive, as indicated by the feature 958. While the stressor 922 is placed on the opposite side of the line 902 to the via 910, the stressor 922 is of sufficient strength to affect the stress within the metal of the via 910.

Alternatively, an area can be determined to be part of a local cathode for placing a stressor to alter an electromigration stress profile for an interconnect. By altering a stress in the interconnect at the local cathode to be less tensile, electromigration failures that occur as a result of voiding at the local cathode are mitigated. Embodiments for which a single tensile stressor is placed at an area of a local cathode for an interconnect are depicted in FIGS. 10 and 11.

Figure 10:
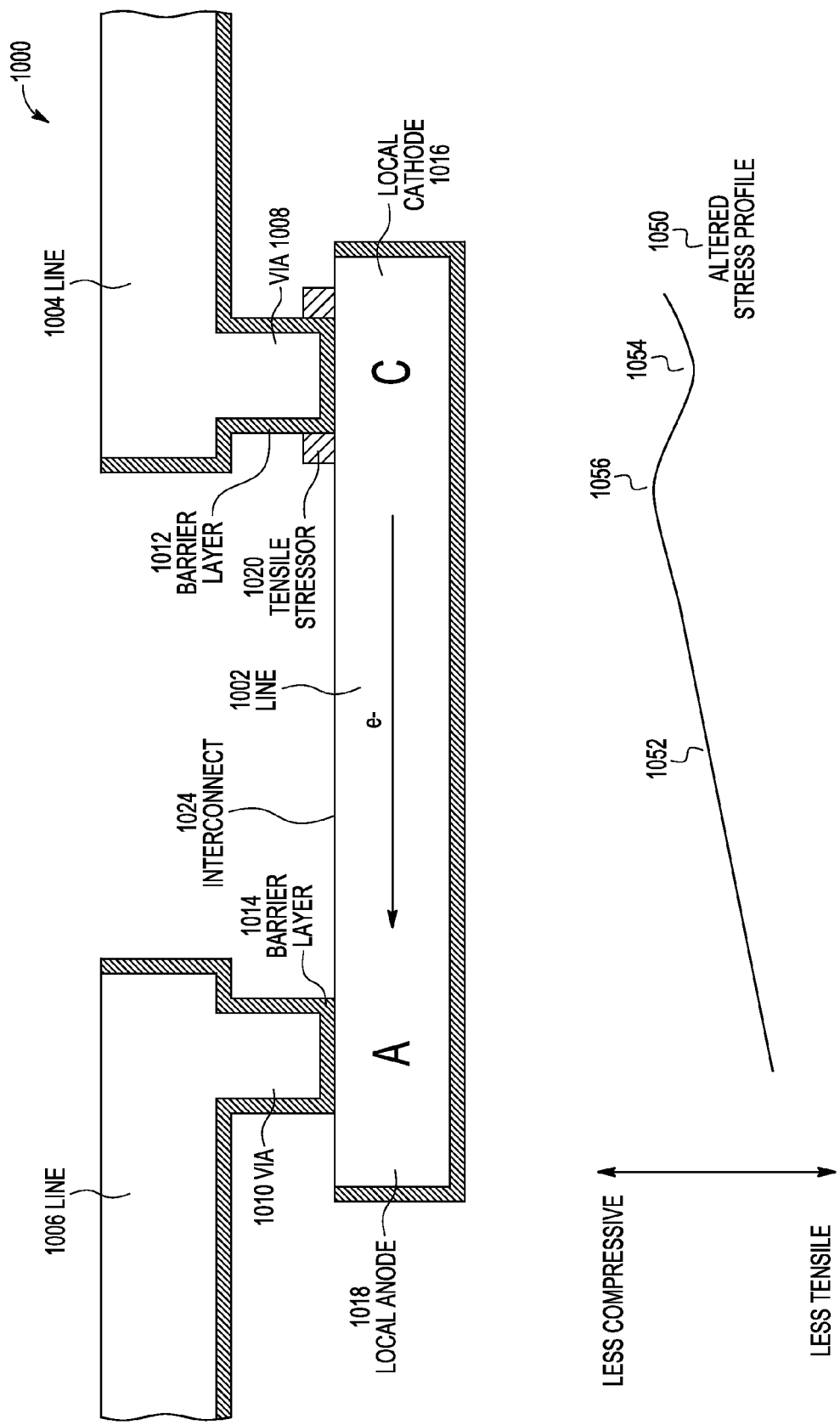
FIG. 10 illustrates a plot of an altered stress profile for an interconnect with a tensile stressor, in accordance with an embodiment.
Figure 11:
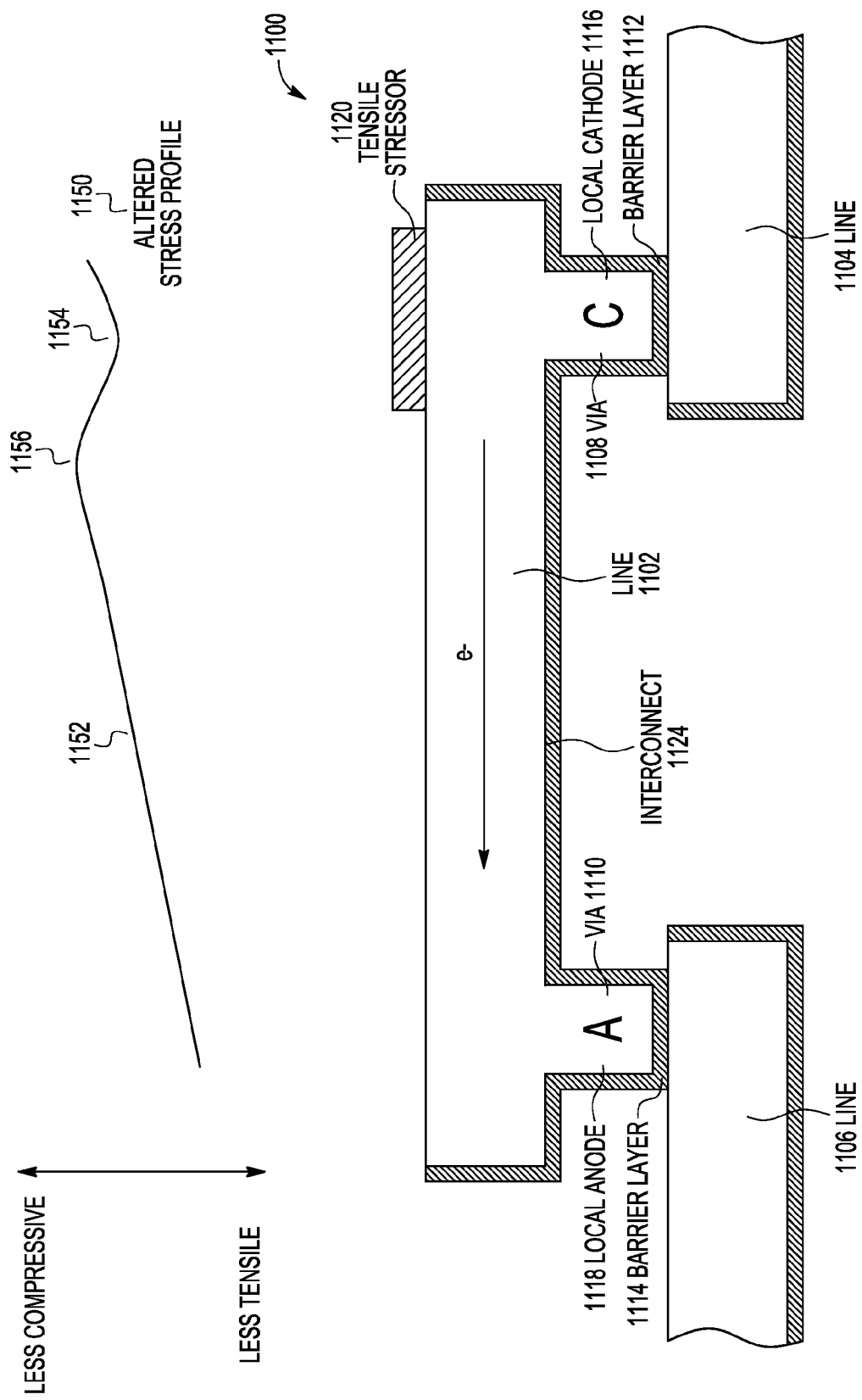
FIG. 11 illustrates a plot of an altered stress profile for an interconnect with a tensile stressor, in accordance with an embodiment.

In particular, FIG. 10 shows a partial interconnect structure 1000. The partial interconnect structure 1000 includes an interconnect 1024 formed by a line 1002. The interconnect 1024 is similar to the interconnect 824, but for which a tensile stressor 1020 is placed at a local cathode 1016 of the interconnect 1024, and for which no stressor is placed at a local anode 1018 of the interconnect 1024. In some instances, the determination of whether a compressive stressor is placed at a local anode for an interconnect or whether a tensile stressor is placed at a local cathode for the interconnect is determined based on available space within an IC device. If there is insufficient space to place a compressive stressor at the local anode for the interconnect, for example, a tensile stressor can be placed at the local cathode for the interconnect.

The interconnect 1024 passes a current which enters the interconnect 1024 through a barrier layer 1012 from a line 1004 and a via 1008, and which leaves the interconnect 1024 through a barrier layer 1014 to a via 1010 and a line 1006. The tensile stressor 1020 is a compressive stress-inducing material that imparts a compressive force on the underlying metal of the interconnect 1024 resulting in an altered stress profile shown at 1050, which includes features 1052, 1054, and 1056.

At a distance away from the stressor 1020, the altered stress profile 1050 shows a characteristic stress gradient that becomes more tensile with decreasing distance to the stressor 1020, as indicated by the feature 1052. At the local cathode 1016, the altered stress profile 1050 becomes less tensile again due to the tensile stressor 1020, as indicated by the feature 1054, which shows a local minimum. The local minimum occurs directly below the center of via 1008 where material is absent from the stressor 1020 to allow the via 1008 to pass through the stressor 1020. Despite the hole in the stressor 1020, the stressor 1020 still affects the stress in the metal of the interconnect 1024 directly below the via 1008. The stressor 1020 does this by compressing the via 1008 at its base, much like a rubber band compressing an object it is wrapped around. The resulting compressive stress created in the via 1008 is transmitted down into the metal of the interconnect 1024. As the metal becomes more compressed, it becomes more difficult for a current carried by the interconnect 1024 to dislodge metal atoms from under and otherwise adjacent to the stressor 1020.

The feature 1056 represents a local maxima between the features 1052 and 1054 that exists beyond the extent of the tensile stressor 1020. It is at the local maxima where the metal of the interconnect 1024 is in its least compressive or most tensile stress state. With less compressive stress holding metal atoms in place, this becomes the statistically most likely location where the current may dislodge metal atoms from within the interconnect 1024 and push them toward the local anode 1018. Because metal atoms under the stressor 1020 are being held in place by a relatively greater amount of compression, they dislodge at a lower rate and are unable to fully replace metal atoms as they are being dislodged from the region of the interconnect 1024 corresponding to the local maximum 1056. The net effect of placing the tensile stressor 1020 at the location of the via 1008 at the local cathode 1016 of the interconnect 1024 is to displace void formation from the location of the via 1008 to other locations of the interconnect 1024.

FIG. 11 shows an embodiment, in addition to the embodiment shown in FIG. 10, for which a tensile stressor is placed above a via on a local-cathode side of an interconnect. A partial interconnect structure 1100 of FIG. 11 shows an interconnect 1124, which includes a line 1102, a via 1108, and a via 1110. The interconnect 1124 conducts an electric current from a line 1104 to a line 1106, each of which is separated from the interconnect 1124 by a barrier layer 1112 and a barrier layer 1114, respectively. Determining an area on the interconnect 1124 for placing a stressor includes determining a direction of the electric current calculated for the interconnect 1124. The electric current flows between the barrier layer 1112, which prevents metal migration into the interconnect 1124 from an interconnect represented by the line 1104, and the barrier layer 1114, which prevents metal migration out of the interconnect 1124 to an interconnect represented by the line 1106. For the immediate embodiment, the determination results in a placement of a tensile stressor 1120 on the interconnect 1124 above the location of the via 1108 on the opposite side of the interconnect 1124 as the via 1108.

Without the stressor 1120, void formation in the via 1108 that represents a local cathode 1116 could eventually break the conduction pathway to the via 1110 that represents a local anode 1118 for the interconnect 1124. The compressive force that the tensile stressor 1120 imparts on the metal of the line 1102 is transmitted through the line 1102 in a downward direction into the via 1108. This places the via 1108 in a less tensile stress state. This is reflected in an altered stress profile 1150 by a feature 1154, which shows a local minimum. Beyond the physical extent of the stressor 1120, however, the tensile stress peaks, as indicated by a feature 1156. The altered stress profile 1150 thereafter becomes less tensile with increasing distance from the stressor 1120, as indicated by a feature 1152.

Without the use of the tensile stressor 1120, voids form more quickly within the via 1108. As voids form, the current density in the via 1108 increases because there is less material remaining to carry the current. This, in turn, accelerates void formation. As with the embodiment shown in FIG. 10, the net effect of placing the tensile stressor 1120 at the location of the via 1108 at the local cathode 1116 of the interconnect 1124 is to displace void formation from the location of the via 1108 to another location in the interconnect 1124. Two failure modes still occur. Weak-mode failures still occur at the via 1108, but the statistical distribution of electromigration failures is shifted toward strong-mode failures occurring within the line 1102. Because the line 1102 has more material than the via 1108, the line will take longer to "void out." Also, the second moment or variance associated with a strong-mode probability distribution for void formation in the line 1102 is greater than for a weak-mode distribution centered at the via 1108. Strong-mode void formation not being as localized as weak-mode void formation also means that the mean lifetime to failure is extended by using a stressor because strong-mode voids will not be as "bunched up." A comparison of distribution functions for an electromigration failure between an interconnect without a stressor and a similar interconnect with a stressor is provided with reference to FIG. 18.

For an embodiment in which the purpose of placing a stressor upon an interconnect at a location of a via is to reduce the likelihood of an electromigration failure at the via, the stressor is wholly located within a threshold distance of the via. In a first example, a stressor can be wholly located within a lateral or vertical distance of a via of up to five times a lateral or vertical dimension, respectively, of the via and still be within a threshold distance of the via. In a second example, a stressor can be wholly located within a lateral distance of a via that is one third the distance along an interconnect between that via and another via that is part of or in electrical contact with the interconnect. In this way, the stressor does not overlap the interconnect midway between the vias. For an embodiment, the physical extent of the stressor completely overlaps the physical extent of the via. The stressor 1120, for example, completely overlaps the via 1108, which "pushes" the local maximum 1156 of the altered stress profile 1150 for the interconnect 1124 beyond the physical extent of the via 1108. This is what results in displacing void formation from the via 1108 to the line 1102. In another embodiment, rather than being placed on top of the interconnect 1124, the stressor 1120 is a portion of the interconnect 1124, at the location of the via 1108, which has an induced stress memory effect.

Figure 12:
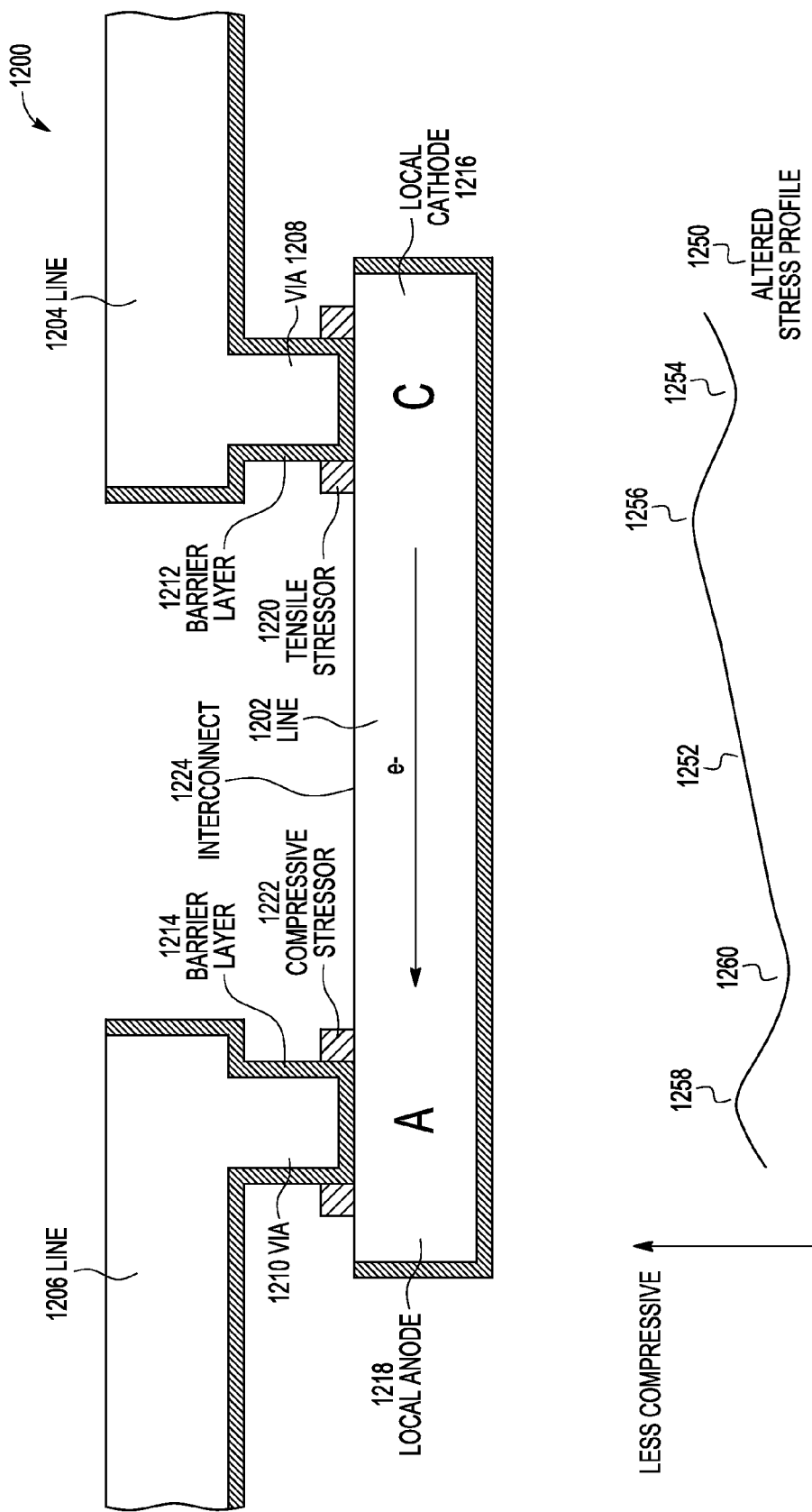
FIG. 12 illustrates a plot of an altered stress profile for an interconnect with multiple stressors, in accordance with an embodiment.
Figure 14:
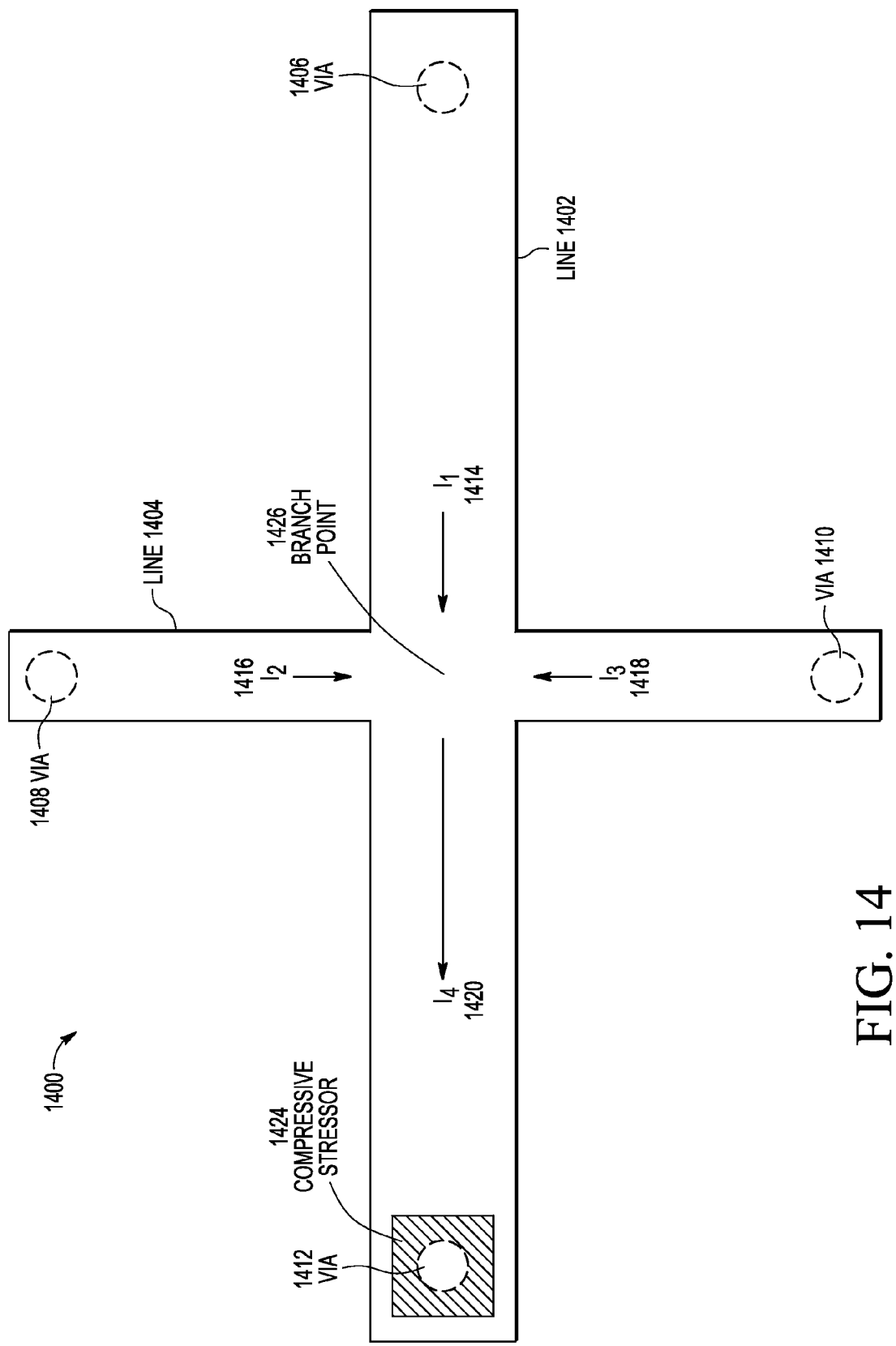
FIG. 14 illustrates a plan view of an interconnect with a branch point and a compressive stressor, in accordance with an embodiment.

FIG. 12 shows an embodiment for which two stressors, both a tensile stressor and a compressive stressor, are placed upon a single interconnect to mitigate different effects of electromigration within the interconnect. A tensile stressor is used to reduce voiding at a local cathode of the interconnect, while a compressive stressor is also used to reduce hillocking at a local anode of the interconnect. If, for example, an electric current within the interconnect is the same or nearly the same at the local cathode and the local anode, then both a tensile stressor and a compressive stressor can be used contemporaneously provided there is sufficient space within an electronic device to do so. Interconnects for which currents differ at a local cathode and a local anode are described with reference to FIGS. 14 and 15.

In particular, FIG. 12 shows a partial interconnect structure 1200 of an IC device with a line 1202 forming an interconnect 1224. The interconnect 1224 is located within a first metal layer resulting from a dual-damascene process and is electrically connected across a barrier layer 1212 to a via 1208 and a line 1204 in a second metal layer. The interconnect 1224 is also electrically connected across a barrier layer 1214 to a via 1210 and a line 1206 in the second metal layer. A tensile stressor 1220 is placed around the via 1208 at a local cathode 1216 of the interconnect 1224 to reduce voiding there. A compressive stressor 1222 is additionally placed around the via 1210 at a local anode 1218 of the interconnect 1224 to reduce hillocking at an opposite side of the interconnect 1224. A resulting altered stress profile for the interconnect 1224 is shown at 1250, which includes features 1252, 1254, 1256, 1258, and 1260.

The feature 1252 shows that the effects of the stressors 1220 and 1222 are local to the areas where the stressors 1220, 1222 are placed. Removed from the stressors 1220, 1222, the altered stress profile 1250 resembles the electromigration stress profile shown at 750, as indicated by the feature 1252. The compressive effect of the tensile stressor 1220 and the tensile effect of the compressive stressor 1222 are indicated by the features 1254 and 1258, respectively. Between the features 1254 and 1252, the feature 1256 shows a local maximum in the altered stress profile 1250 that causes voids to be displaced away from the via 1208, and between the features 1258 and 1252, the feature 1260 shows a local minimum in the altered stress profile 1250 that causes hillocks to be displaced away from the via 1210.

Figure 13:
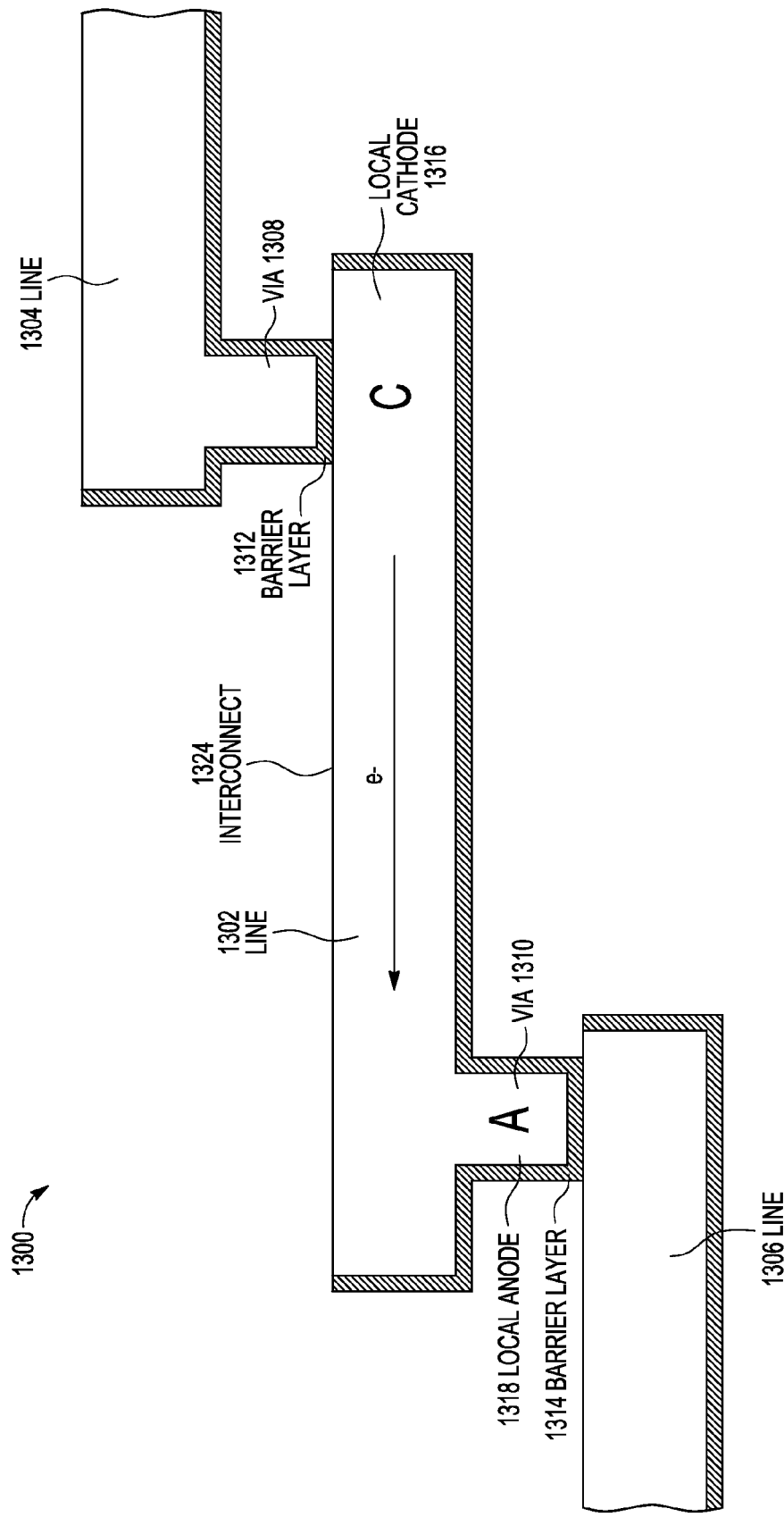
FIG. 13 illustrates a cross-sectional view of an interconnect electrically connected to two other interconnects within different metal layers.

Previous figures illustrating the placement of stressors show interconnects formed in a dual-damascene process that each have electrical connections to two additional interconnects, where the two additional interconnects are both in the same metal layer. For another embodiment, a first interconnect is electrically connected to a second and a third interconnect with each interconnect being in a different metal layer. Such an embodiment is shown in FIG. 13 by a partial interconnect structure 1300, which is similar to the partial interconnect structure 400 shown in FIG. 4. FIG. 13 also shows that determining a placement of a tensile stressor at a local cathode of an interconnect or a placement of a compressive stressor at a local anode of the interconnect can be based on differing geometries at the local cathode and the local anode. The partial interconnect structure 1300 includes a line 1306 within a first metal layer, a line 1302 and a via 1310 within a second metal layer, and a line 1304 and a via 1308 within a third metal layer. The partial interconnect structure 1300 also includes a barrier layer 1312 between the line 1302 and the via 1308, and a barrier layer 1314 between the line 1306 and the via 1310. The line 1302 together with the via 1310 form an interconnect 1324 in the second metal layer, which is electrically connected to an interconnect formed by the line 1306 within the first metal layer. The interconnect 1324 is also electrically connected to an interconnect formed by the line 1304 and the via 1308 within the third metal layer. In one embodiment, a compressive stressor used at a local anode 1318 of the interconnect 1324 is placed on the interconnect 1324 above the location of the via 1310 on an opposite side of the interconnect 1324 as the via 1310. In another embodiment, a tensile stressor used at a local cathode 1316 of the interconnect 1324 is placed on the interconnect 1324 at the location of the via 1308 on a same side of the interconnect 1324 as the via 1308. In a further embodiment, both a compressive stressor and a tensile stressor are used together.

In some instances, determining whether a tensile stressor should be placed at a local cathode of an interconnect or whether a compressive stressor should be placed at a local anode of the interconnect is based on currents within the interconnect that differ at the local anode and local cathode. This occurs, for example, when a first interconnect makes electrical contact with three or more other interconnects, which results in the first interconnect having branch points where currents can divide or add. Shown in FIG. 14, for example, is an interconnect 1400 having a single branch point 1426 formed by a line 1402 interconnecting with a line 1404. The interconnect 1400 is electrically connected by vias 1406, 1408, 1410, and 1412 to four other interconnects (not shown). The via 1406 is a source of a current $I_1$ 414 and therefore represents a local cathode for the interconnect 1400. Similarly, the vias 1408 and 1410 are sources of a current $I_2$ 1416 and a current $I_3$ 1418, respectively. Therefore, the vias 1408 and 1410 also represent local cathodes for the interconnect 1400. The via 1412, on the other hand, is a sink for a current $I_4$ 1420 and therefore represents a local anode for the interconnect 1400. Currents $I_1$ 1414, $I_2$ 1416, and $I_3$ 1418 from the three local cathodes add at the branch point 1426 to produce the current $I_4$ 1420. Therefore, via 1412 carries a greater current than any of the vias 1406, 1408, or 1410. Based on this, a compressive stressor 1424 is placed on the interconnect 1400 at a location of the via 1412.

Figure 15:
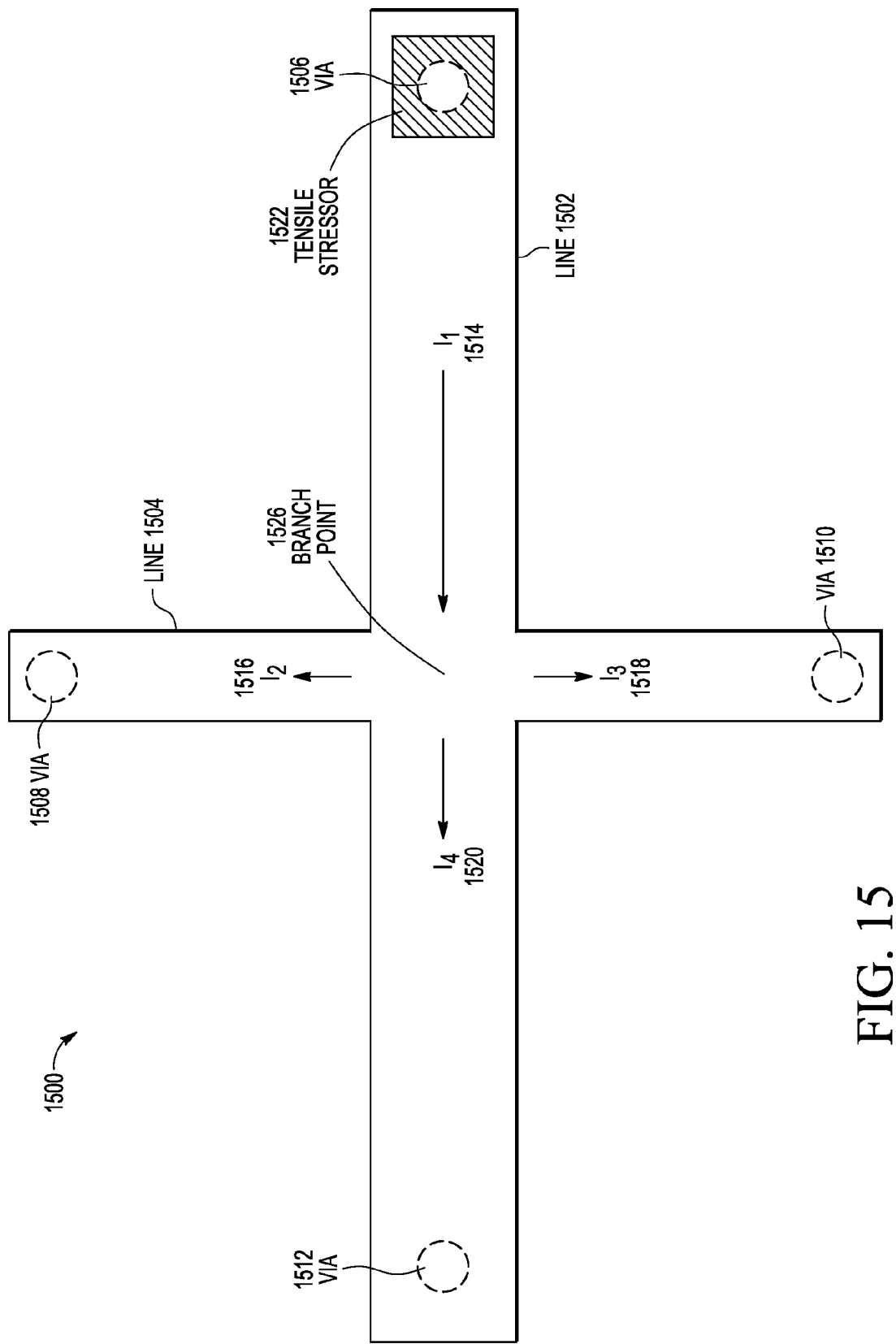
FIG. 15 illustrates a plan view of an interconnect with a branch point and a tensile stressor, in accordance with an embodiment.

In another example, FIG. 15 shows an interconnect 1500 with a single branch point 1526 formed from an interconnection of a line 1502 with a line 1504. At the branch point 1526, a current $I_1$ 1514 originating from a via 1506, which represents a local cathode of the interconnect 1500, divides into currents $I_2$ 1516, $I_3$ 1518, and $I_4$ 1520 that flow toward vias 1508, 1510, and 1512, respectively, all of which represent local anodes of the interconnect 1500. Because the currents $I_2$ 1516, $I_3$ 1518, and $I_4$ 1520 sum to the current $I_1$ 1514, the via 1506 carries the greatest current. Therefore, a tensile stressor 1522 is placed at the via 1506. The tensile stressor 1522 reduces void formation in the via 1506 if the via 1506 is included in the interconnect 1500, or it reduces void formation under the via 1506 if the via 1506 is separated from the interconnect 1500 by a barrier layer.

Figure 16:
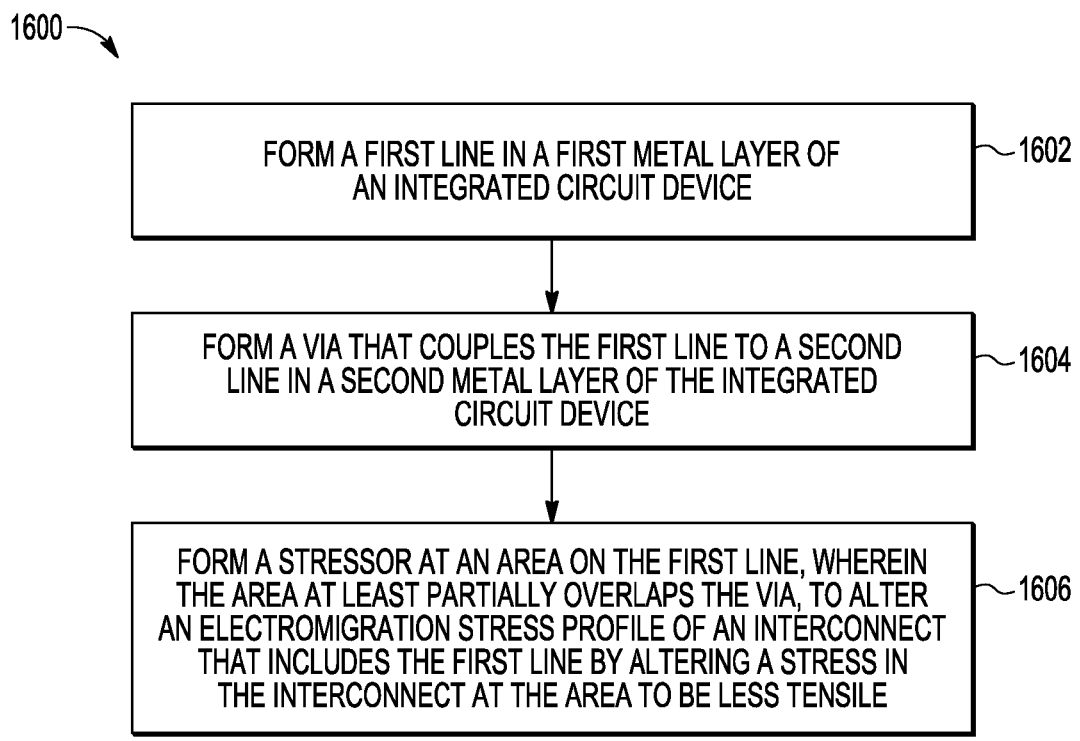
FIG. 16 is a flow diagram illustrating a method for manufacturing an integrated circuit device that includes stressors, in accordance with an embodiment.

A method for manufacturing an IC device that includes interconnects upon which stressors are placed is specified in FIG. 16. In particular, FIG. 16 shows a method 1600 that includes forming 1602 a first line, for example, by using a dual-damascene process, within a first metal layer of the IC device. The method 1600 also includes forming 1604 a first via that electrically couples the first line to a second line within a second metal layer of the IC device. In one embodiment, a metal deposition process or a layer patterning process other than a dual-damascene process is used to form the first via and the first and second lines. The method 1600 further includes forming 1606 a stressor at an area on the first line, wherein the area at least partially overlaps the first via, to alter an electromigration stress profile of an interconnect that includes the first line by altering a stress in the interconnect at or below the area to be less tensile. The area at which the stressor is formed at least partially overlapping the first via means that at least a portion of the area on which the stressor is formed is in vertical alignment with at least a portion of the first via or that the area encloses, not necessarily on all sides, the first via. In FIG. 10, for example, the area on which the stressor 1020 is formed encloses the via 1008. In FIG. 11, at least a portion of the area on which the stressor 1120 is formed is in vertical alignment with he via 1108.

The stressor might be formed, for instance, by using a physical or chemical vapor deposition process. For different embodiments, stressors can apply different levels of stress. In one embodiment, for example, when an electric current in an interconnect will exceed an electromigration threshold current for the interconnect by thirty percent, a stronger stressor is formed as compared to a strength of a stressor formed when the electric current will exceed the electromigration threshold current by only five percent. For a first embodiment, a stressor that applies a greater level of stress is formed from a greater amount of material. For example, a stronger stressor may be thicker than a relatively weaker stressor. For a second embodiment, stressors that apply different levels of stress are formed under different conditions. For example, by altering a pressure, a temperature, and/or a flow rate of gas used to form a stressor, the strength of the stressor can be controlled. In a third embodiment, different materials are used to form stressors having different strengths.

In one embodiment, the first via is formed above the first line and is separated from the first line by a barrier layer such that the first via is not part of the interconnect that includes the first line. For this embodiment, the stressor is placed on the same side of the interconnect as the first via, such as is shown for the partial interconnect structure 1000 of FIG. 10. In another embodiment, the first via is formed below the first line such that the first via is part of the interconnect that includes the first line. For this embodiment, the stressor is placed on the opposite side of the interconnect as the first via, such as is shown for the partial interconnect structure 1100 of FIG. 11.

For some embodiments, a set of additional vias is formed, each within a threshold distance of the first via, and each configured to couple the first line to the second line. As defined herein, a set can include only a single element or multiple elements. The threshold distance is defined so that the first via and the set of additional vias form a group of vias that are localized so that the greatest distance between any two vias in the group is less than one third the length of the first line. For a particular embodiment, the distance between neighboring vias in the group of vias is on the order of a diameter for the vias. In one embodiment, forming the set of additional vias mitigates the effects of stress migration.

An explanation of how the placement of a tensile stressor at a local cathode of an interconnect can exacerbate the effects of stress migration is provided with reference to FIG. 10. The placement of the tensile stressor 1020 creates a localized depression in the altered stress profile 1050, as indicated by the feature 1054. This depression shows a localized stress gradient for which a stress state of the metal in the line 1002 under the stressor 1020 becomes less tensile toward the center of the stressor 1020. For stress migration, such as when an IC device is powered down and the line 1002 does not carry an electric current, voids in the metal of the line 1002 can migrate along the stress gradient and collect under the stressor 1020. The voids migrate along the stress gradient to relax the stressed state of the metal. Stress migration and the accumulation of voids is of greater concern in longer and wider lines which have a greater volume of metal and therefore an increased number of voids. Depending upon a geometry of a line of an interconnect, additional vias may be added at a local cathode for the interconnect to make stress migration less of a concern.

Figure 17:
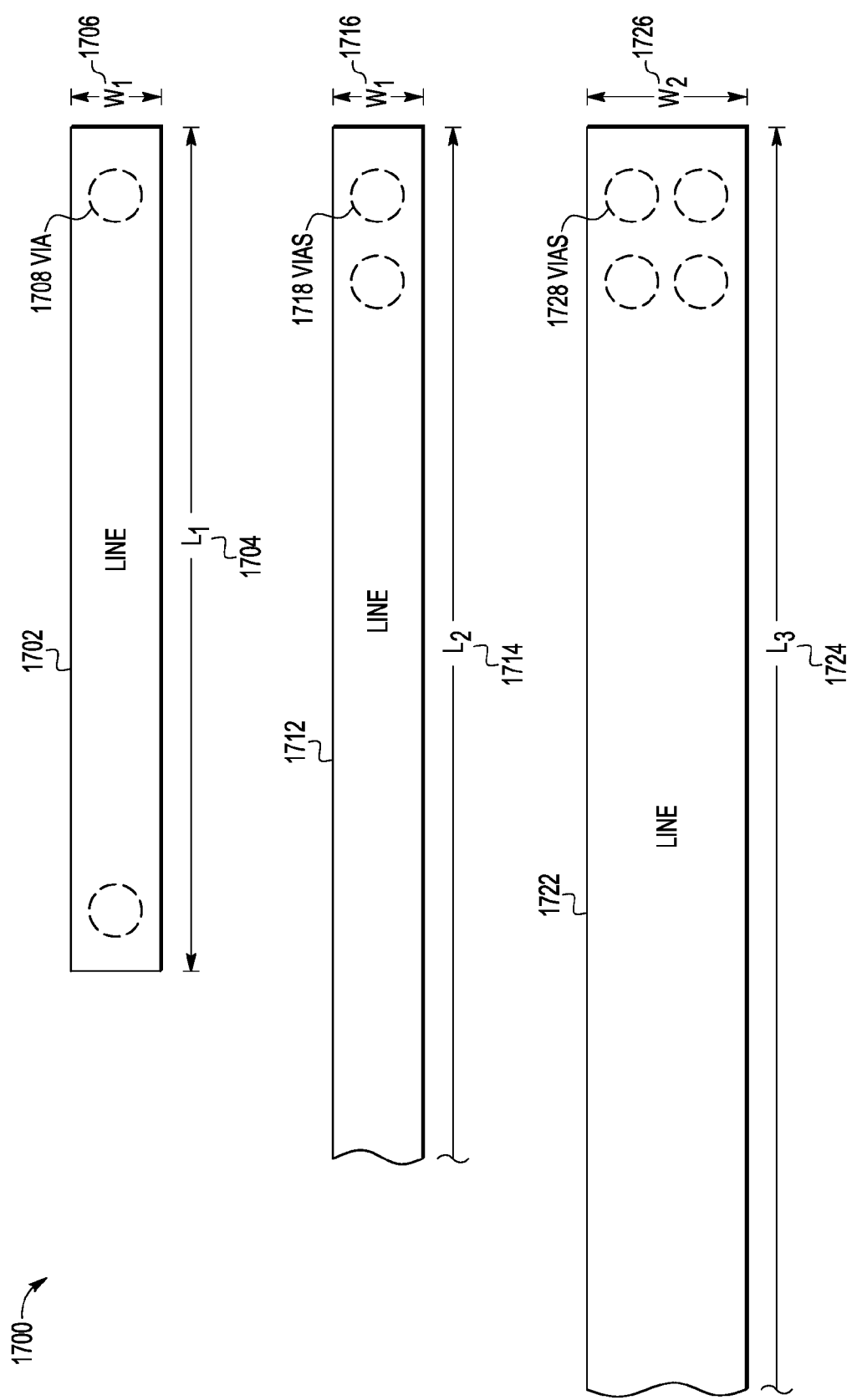
FIG. 17 illustrates a plan view of portions of multiple interconnects each having a different number of metal vias, in accordance with an embodiment.

FIG. 17 shows embodiments for which additional vias are added to an interconnect to handle stress migration. FIG. 17 illustrates three different lines 1702, 1712, 1722, each having a different number of vias on a local-cathode side, taken as the right-hand side, where a tensile stressor (not shown) is placed. The line 1702 is the shortest and among the narrowest of the three lines 1702, 1712, 1722. It has a length $L_1$ 1704 and a width $W_1$ 1706. The line 1702 appears with only a single via 1708 on its local-cathode side. Additional vias are not formed in the line 1702 because its geometry serves to mitigate the effects of stress migration.

The line 1712 has a same width $W_1$ 1716 as the line 1702 but has a greater length $L_2$ 1714. For the line 1712, a group of two vias 1718 is placed on its local-cathode side. While the line 1712 is not carrying a current and voids accumulate at the vias 1718 due to stress migration, the accumulating voids are divided amongst the two vias 1718. It will therefore take a longer period of time to void out both vias 1718 and cause an electromigration failure. For embodiments where it is not known how an IC device will be used, specifically the periods of time for which it will be powered off, an additional via is added when a tensile stressor is used on the local-cathode side of an interconnect. The stressor mitigates the effects of electromigration when the IC device is powered on, and the additional via mitigates the effects of stress migration when the IC device is powered off.

In longer lines of greater cross section, such as lines formed in upper metal layers of an IC device using a dual-damascene process, groups of more than two vias can be used in combination with tensile stressors. The line 1722, for example, is both longer and wider than the lines 1702 and 1712. It has a length $L_3$ 1724 with a width of $W_2$ 1726, and is formed with a group of four vias 1728 on its local-cathode side. Because the line 1722 is wider, the vias 1728 are arranged in two columns and two rows to keep all the vias 1728 within a threshold distance of one another. By comparison, the line 1712 is only wide enough to accommodate a single row of vias 1718.

In different embodiments, grouping vias within a threshold distance of one another means that an edge-to-edge spacing between any via of the group and its nearest neighbor is less than or equal to a particular spacing of between 2.0 and 2.5 times a minimum via spacing allowed by a technology used to form the vias. For instance, if a minimum edge-to-edge via spacing allowed by a technology is 70 nm, then a maximum threshold spacing for an embodiment is between 140 and 175 nanometers (nm). For one embodiment, an edge-to-edge via spacing of 1.5 times a minimum spacing allowed by a technology is used. For another embodiment, the edge-to-edge spacing between vias increases as the number of vias within a group increases, but the maximum spacing between vias is limited by 2.5 times the minimum spacing allowed by the technology used to form the vias.

By placing all the vias of a group within a threshold distance of any one via of the group, the group of vias is spatially confined so that a vacancy sharing effect needed to mitigate the effects of stress migration is realized. Vacancies driven by stress migration no longer collect at a single via to form a void. Additionally, a smaller tensile stressor can be used to completely overlap the group of vias. The tensile stressor overlaps all the vias of the group so that electromigration void formation is displaced away from each via of the group beyond the extent of the tensile stressor and into a line electrically connected to the group of vias.

For some embodiments, the number of vias used at a local cathode of an interconnect to mitigate the effects of stress migration is determined using an algorithm based on a length and/or a width of a line of the interconnect and created using empirical data resulting from testing. In different embodiments, multiple vias might be used on lines that exceed particular lengths within a range of 15 to 50 microns. In another embodiment, multiple vias might be used when the width of a line exceeds three times a minimum width of the line allowed under a technology used to form the line. For instance, if the minimum allowed line width is 70 nm, then multiple vias are used in lines that exceed 210 nm in width.

Figure 18:
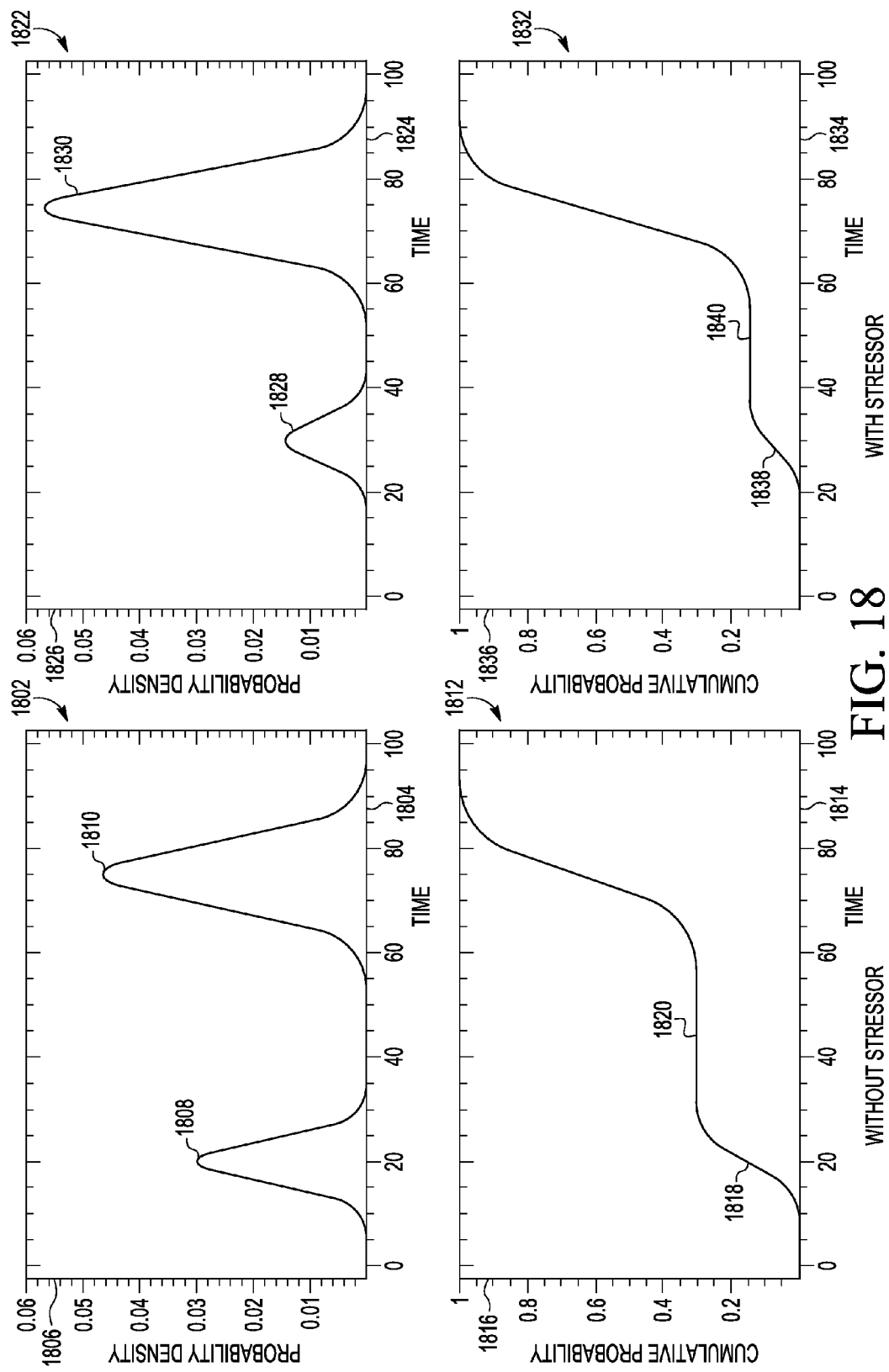
FIG. 18 illustrates a plot of a probability density function and a corresponding cumulative distribution for an electromigration failure without the use of a stressor as compared to with the use of a stressor, in accordance with an embodiment.

FIG. 18 shows four plots that illustrate how placing a stressor on an interconnect can delay the onset of an electromigration failure. Specifically, plot 1802 shows a normalized probability density function for a random variable that represents an electromigration failure within an interconnect without a stressor. Plot 1822 shows how the normalized probability density function shown in the plot 1802 is altered by the placement of a stressor on the interconnect. The plots 1802 and 1822 each show arbitrary units (au) of time on an abscissa axis at 1804 and 1824, respectively, and a probability density on an ordinate axis at 1806 and 1826, respectively.

Plot 1812 shows a cumulative distribution for the probability density function of plot 1802 for the interconnect without the stressor. Similarly, plot 1832 shows a cumulative distribution for the probability density function of plot 1822 for the interconnect with the stressor. The plots 1812 and 1832 each show the same arbitrary units of time on an abscissa axis at 1814 and 1834, respectively, as shown for plots 1802 and 1822. Ordinate axes 1816 and 1836 for the plots 1812 and 1832, respectively, show units of cumulative probability.

The probability density function of the plot 1802 is bimodal, as indicated by a feature 1808 and a feature 1810. The feature 1808 represents the occurrence of a weak-mode failure at a via of the interconnect and the feature 1810 represents the occurrence of a strong-mode failure in a line of the interconnect not adjacent to the via. Because weak-mode failures are shown to occur before strong mode failures, the failures are also referred to as early-mode and late-mode failures, respectively. Features 1828 and 1830 of the altered probability density function of the plot 1822 for the interconnect with the stressor correspond to the features 1808 and 1810, respectively, for which the stressor is not used.

A comparison of the feature 1808 with the feature 1828 indicates that the placement of the stressor on the interconnect reduces the probability of an early-mode failure, as indicated by the reduced area under the feature 1828 as compared to the area under the feature 1808. An amplitude of the feature 1808 is approximately 0.030, whereas an amplitude of the feature 1828 is approximately 0.012. Additionally, the probability that an early-mode failure will occur when using the stressor is shifted toward later times. The feature 1808 is centered at 20 au, whereas the feature 1828 is centered at 30 au. The placement of the stressor that alters a probability density function from the one shown in the plot 1802 to the one shown in the plot 1822 also alters a cumulative distribution from the one shown in the plot 1812 to the one shown in the plot 1832.

For the cumulative distributions of the plots 1812 and 1832, features 1818 and 1838, respectively, represent points of inflection, and features 1820 and 1840, respectively, represent plateaus where the cumulative probability is not changing with time. The point of inflection 1818 occurs at 20 au, where the probability of an early-mode failure for the interconnect without the stressor is greatest. The point of inflection 1838 occurs at 30 au, where the probability of an early-mode failure for the interconnect with the stressor is greatest. By placing the stressor on the interconnect, the probability of a failure for the interconnect begins to accumulate later in time, which increases the mean lifetime of the interconnect.

A height of the plateau 1820 represents the area under the feature 1808 or a cumulative probability that an early-mode electromigration failure will occur in the interconnect without the stressor at a time for which the plateau 1820 is shown. Similarly, a height of the plateau 1840 represents the area under the feature 1828 or a cumulative probability that an early-mode electromigration failure will occur in the interconnect with the stressor at a time for which the plateau 1840 is shown. Comparing the feature 1820 with the feature 1840 shows that without the use of a stressor, there is a 30 percent probability that an early-mode failure will occur in the interconnect within a time of 30 au. However, when the stressor is used, there is only a 15 percent probability that an early-mode failure will occur in the interconnect within a greater time of 40 au.

Figure 19:
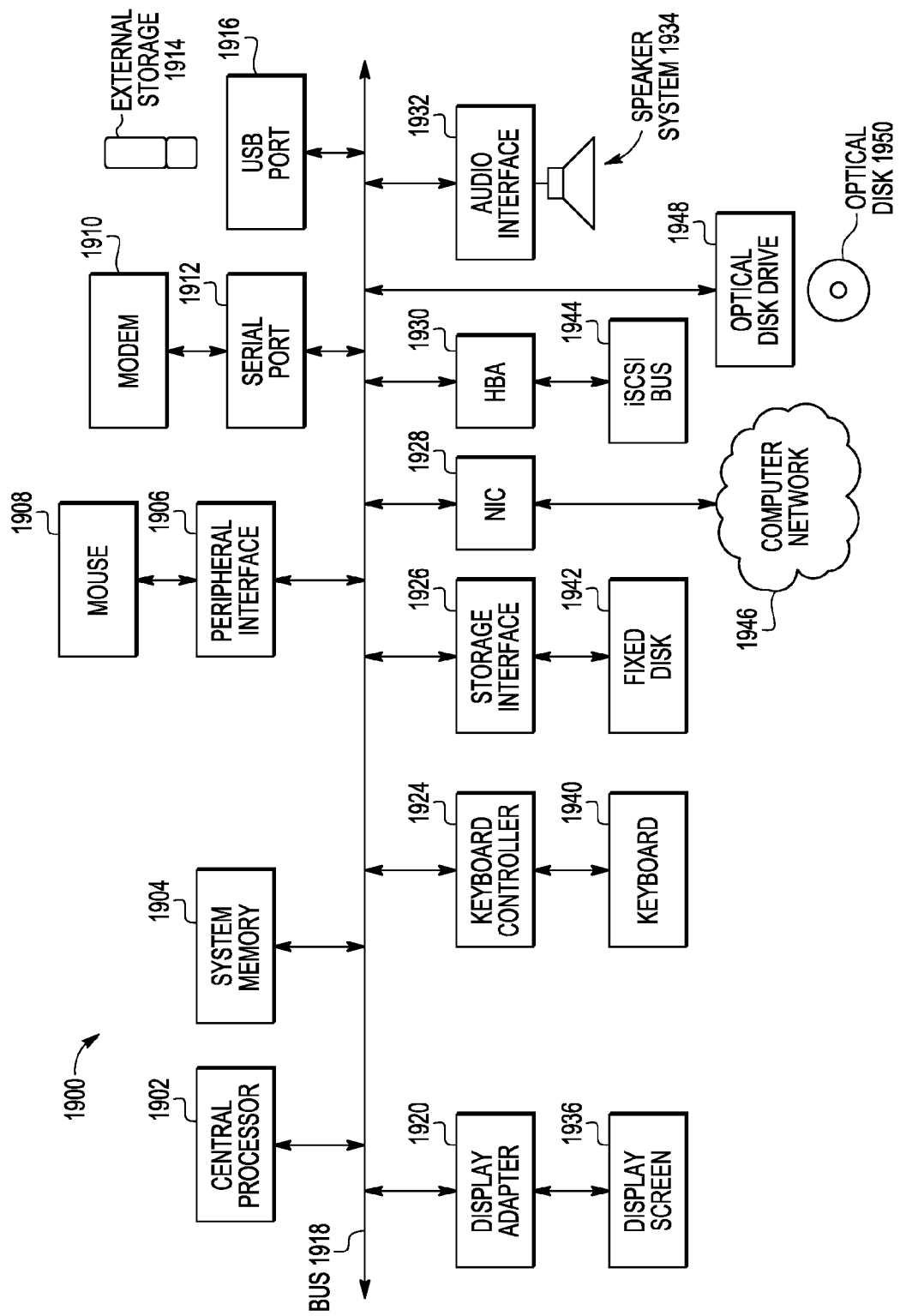
FIG. 19 is a simplified block diagram illustrating part of a circuit simulation system for selecting locations within an integrated circuit device for placing stressors, in accordance with an embodiment.

FIG. 19 depicts a simplified block diagram 1900 illustrating part of a circuit simulation system for selecting locations within an integrated circuit device for placing stressors. In particular, the block diagram 1900 represents a computer system suitable for running a circuit simulation engine. The computer system 1900 includes a bus 1918 that interconnects major hardware subsystems of the computer 1900 such as: a central processor 1902; system memory 1904, which can be a random access memory (RAM) implemented as main memory for the computer 1900, but the system memory 1904 can also include one or more of read only memory (ROM), flash RAM, etc., as a single or multiple hardware memory devices; a peripheral interface 1906; a serial port 1912; a USB port 1916; a display adapter 1920; a keyboard controller 1924; a storage interface 1926; a network interface controller (NIC) 1928; a host bus adapter (HBA) 1930, also referred to as a converged network adaptor; an optical disk drive 1948; and an audio interface 1932. Many other devices and subsystems (not shown) may be connected in a similar manner. Conversely, all of the devices shown in FIG. 19 need not be present to practice described embodiments. Moreover, the devices and subsystems can be interconnected in different ways from that shown in FIG. 19.

The central processor 1902 is configured, in at least one embodiment, to execute one or more software and/or firmware applications or programs, referred to herein as applications, which can be stored in the system memory 1904. For example, the central processor 1902 executes programs to control the operation of the computer as a whole, such as an operating system (OS). In a particular embodiment, the central processor 1902 represents a single processor, and in an alternative embodiment, the central processor 1902 represents multiple hardware elements that include arithmetic logic and control circuitry necessary to perform the digital processing, in whole or in part, for the computer system 1900 to allow the circuit simulation system to identify locations within an integrated circuit device for placing stressors in accordance with described embodiments.

The peripheral interface 1906 represents hardware operative to connect peripheral devices to the computer 1900 such as a mouse 1908 or another type of peripheral device such as a headset or earpiece. In a particular embodiment, the peripheral interface 1906 includes transceiver hardware that supports short-ranged communications such as Bluetooth communications, and the like, to create wireless links to wireless-enabled devices. The serial port 1912 represents one or more physical interfaces that support communicating serial data streams. In the particular implementation shown, the serial port 1906 is operative to interface with a modem 1910 to connect to an external server, for instance. In one example implementation, the serial port 1912 is compliant with the RS-232 standard. However, the serial port 1912 can support other interfaces including, but not limited to, an Ethernet interface, a FireWire Interface, etc.

The USB port 1916 is compliant with the USB standard and can be configured as a receptacle to receive a standard, mini, or micro USB plug to connect to devices such as an external storage device 1914 like a flash drive or other electronic devices including peripheral devices such as a keyboard, a point-and-click device, a printer, etc. The display adapter 1920 can be an expansion card used to provide graphic images to a display screen 1936 of a monitor connected to the computer 1900. The keyboard controller 1924 is operative to interface an external keyboard 1940 to the central processor 1602 by alerting the central processor 1902 when a key is pressed and providing the keyboard input for processing. In an embodiment, the keyboard controller 1924 functionality is contained within the USB port 1916.

The storage interface 1926 is configured to connect a standard computer-readable medium for storage and/or retrieval of information such as a fixed disk drive 1942 that may or may not be an internal component of the computer 1900. The NIC 1928 is configured to connect the computer 1900 to a computer network 1946. For example, the NIC 1928 includes the electronic circuitry required to wirelessly communicate using a specific physical layer and data link layer protocol such as Wi-Fi. This provides a base for a full network protocol stack, allowing communication with a computer network 1946. This can facilitate communication among small groups of computers on a same local area network (LAN) and large-scale network communications through routable protocols, such as Internet Protocol (IP). The HBA 1930 connects the computer 1900 to an external device or system such as external storage facility using a bus 1944. In this case, the bus 1944 is configured to implement Internet Small Computer System Interface (iSCSI), which is an IP-based storage networking standard for linking data storage facilities. The optical disk drive 1948 is configured to receive an optical disk storage device 1950; and the audio interface 1932 is configured to connect an external audio device, such as an external speaker system 1934, to the computer 1900.

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

For the sake of brevity, conventional techniques related to circuit simulation and modeling, various laws by which circuits operate, such as Kirchhoff's law, solving partial and ordinary differential equations, matrix mathematics, and other functional aspects of a circuit and package system may not be described in detail. Furthermore, the connecting lines shown in the various figures contained herein are intended to represent example functional relationships and/or physical couplings between the various elements. It should be noted that many alternative or additional functional relationships or physical connections may be present in a practical embodiment.

Moreover in this document, the terms "comprises," "comprising," "has," "having," "includes," "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially," "essentially," "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to," "configured with," "arranged to," "arranged with," "capable of" and any like or similar terms means that referenced elements have a physical arrangement and/or physical coupling and/or connectivity with other elements in an inactive state. This physical arrangement and/or physical coupling and/or connectivity while in the inactive state enables the elements to perform stated functionality while in the active state. Although the various circuit schematics shown herein depict certain example arrangement of elements, additional intervening elements, devices, features, or components may be present in an actual embodiment, assuming that the functionality of the given circuit is not adversely affected.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for selecting locations within an integrated circuit device for placing stressors to manage electromigration failures, the method comprising:
   calculating an electric current for a first interconnect within the integrated circuit device;
   determining an electromigration stress profile for the first interconnect based on the electric current; and
   determining an area on the first interconnect for placing a stressor to alter the electromigration stress profile for the first interconnect.

2. The method of claim 1, wherein the determining the area comprises determining an area within a threshold distance of a via that is in electrical contact with the first interconnect.

3. The method of claim 1, wherein the determining the area comprises selecting the area in order to oppose a stress gradient identified by the electromigration stress profile for the first interconnect.

4. The method of claim 1, wherein the calculating the electric current comprises determining a direction of the electric current.

5. The method of claim 4, wherein the calculating the electric current further comprises determining the direction of the electric current across a barrier layer that prevents metal migration between the first interconnect and a second interconnect in electrical contact with the first interconnect.

6. The method of claim 4, wherein the determining the area for placing the stressor further comprises determining, based on the direction of the electric current calculated for the first interconnect, a local anode or a local cathode for the first interconnect.

7. The method of claim 6, wherein the area for placing the stressor is determined as being at one of:
   the local anode to alter the electromigration stress profile for the first interconnect by altering a stress at the area to be less compressive;
   the local cathode to alter the electromigration stress profile for the first interconnect by altering a stress at the area to be less tensile.

8. The method of claim 1, wherein the determining the electromigration stress profile based on the electric current calculated for the first interconnect comprises determining the electromigration stress profile based on an electric current density calculated for the first interconnect.

9. The method of claim 1, wherein the determining the electromigration stress profile based on the electric current calculated for the first interconnect comprises determining the electromigration stress profile based on a time-averaged electric current for the first interconnect.

* * * * *